United States Patent
Shand et al.

(10) Patent No.: US 11,773,716 B2
(45) Date of Patent: Oct. 3, 2023

(54) SYSTEM, METHOD AND DEVICE FOR FLUID CONDUIT INSPECTION

(71) Applicant: INGU Solutions Inc., Calgary (CA)

(72) Inventors: Zachary Shand, Calgary (CA); Johannes Hubertus Gerardus van Pol, Calgary (CA); Anouk van Pol, Calgary (CA)

(73) Assignee: INGU Solutions Inc., Calgary (CA)

( * ) Notice: Subject to any disclaimer, the term of this patent is extended or adjusted under 35 U.S.C. 154(b) by 0 days.

(21) Appl. No.: 17/165,029

(22) Filed: Feb. 2, 2021

(65) Prior Publication Data

US 2021/0238991 A1    Aug. 5, 2021

Related U.S. Application Data

(60) Provisional application No. 62/979,831, filed on Feb. 21, 2020, provisional application No. 62/969,330, filed on Feb. 3, 2020.

(51) Int. Cl.
*G01R 33/02* (2006.01)
*E21B 47/11* (2012.01)
(Continued)

(52) U.S. Cl.
CPC ............ *E21B 47/117* (2020.05); *G01B 7/281* (2013.01); *G01R 33/0011* (2013.01); *G01R 33/02* (2013.01)

(58) Field of Classification Search
CPC ......... E21B 47/117; G01B 7/28; G01B 7/281; G01R 33/00; G01R 33/0011; G01R 33/02;
(Continued)

(56) References Cited

U.S. PATENT DOCUMENTS

2008/0204008 A1    8/2008  Paulson
2018/0107202 A1*   4/2018  Hsueh ................ G05B 23/0272
(Continued)

OTHER PUBLICATIONS

Dubov et al., "Asessment of the Material State of Oil and Gas Pipelines Based on the Metal Magnetic Memory Method", Welding in the World, pp. 11-19, vol. 56, No. 3/4, Mar. 1, 2021.
(Continued)

*Primary Examiner* — Son T Le
(74) *Attorney, Agent, or Firm* — Own Innovation; James W. Hinton

(57) ABSTRACT

Systems, methods, and sensor devices for fluid conduit inspection using passive magnetometry are provided. A method of inspecting a fluid conduit using passive magnetometry includes collecting magnetic flux data from inside the fluid conduit without actively magnetizing the fluid conduit, the magnetic flux data representing a residual magnetization of the fluid conduit, and identifying a conduit condition for the fluid conduit using the magnetic flux data. A computer system includes a memory for storing magnetic flux data collected from inside the fluid conduit without active magnetization of the fluid conduit, the magnetic flux data representing a residual magnetization of the fluid conduit; and a processor in communication with the memory and configured to generate an electronic representation of a conduit condition for the fluid conduit based on the magnetic flux data, wherein the electronic representation is stored in the memory.

17 Claims, 14 Drawing Sheets

(51) Int. Cl.
*E21B 47/117* (2012.01)
*G01B 7/28* (2006.01)
*G01R 33/00* (2006.01)

(58) Field of Classification Search
CPC ........ G01N 27/82; G01N 33/22; G01N 33/28; G01N 33/1886; G01N 22/02; G01N 21/892
See application file for complete search history.

(56) References Cited

U.S. PATENT DOCUMENTS

| | | | |
|---|---|---|---|
| 2018/0171783 A1 | 6/2018 | van Pol et al. | |
| 2019/0094182 A1 | 3/2019 | Andrew et al. | |
| 2020/0367773 A1* | 11/2020 | Wang | A61B 5/02405 |
| 2020/0381157 A1* | 12/2020 | Sutherland | H01F 13/006 |

OTHER PUBLICATIONS

European Patent Office, Extended European Search Report for EP Patent App. No. 21020046.5, dated Jun. 7, 2021.
European Patent Office, Examination report for EP Patent App. No. 21020046.5, dated May 17, 2023.
Zhang et al., "Non-Destructive Detection of Wire Rope Discontinuities from Residual Magnetic Field Images Using the Hilbert-Huang Transform and Compressed Sensing", Sensors 2017, Mar. 16, 2017, pp. 1-19, vol. 17, No. 608.

* cited by examiner

SYSTEM, METHOD AND DEVICE FOR FLUID CONDUIT INSPECTION

TECHNICAL FIELD

The following relates generally to fluid conduit inspection, and more particularly to fluid conduit inspection using passive magnetometry.

INTRODUCTION

Fluid conduit inspection may be used to gather insights into the overall condition of a pipeline (or other fluid conduit), as well as potential defects or anomalies within the pipeline. Such insights may be provided to an owner, operator, regulator, or other beneficiary or interested party and used, for example, to determine and implement remedial efforts.

Many pipeline assets exist which have poorly documented history or may otherwise be in unknown condition and could be difficult to inspect economically. In Alberta and Saskatchewan in particular, there is a lot of infrastructure from as far back as the 1960s which gets reused, sold off, or otherwise changes ownership. This older infrastructure may not have accurate as-builts and could be in unknown condition. These pipelines, therefore, present uncertain risk from an integrity perspective and it may not be known if these lines are piggable (can be inspected with a traditional inline inspection tool). In these instances, it may be valuable to identify any piggability concerns, such as bends and wall thickness changes. An overall condition comparison or assessment may be used to help identify or prioritize lines which need to be inspected by a high-resolution ILI tool.

In addition, because these pipelines could be put back into service or reactivated, it is valuable to identify any changes in construction history. For example, an older portion of a pipeline may be connected to a newer line. This information can be used to help operators identify potential pipeline segments with important historical differences in the pipeline's quality or condition. For example, a pipeline built in the 1960s could have tar tape instead of yellow jacketing because of its age, which may drastically increase the risk of external corrosion.

One existing approach to pipeline inspection is to use a magnetic flux leakage (MFL) tool. Such tools may operate by actively magnetizing the pipeline and may be bulk, heavy, and use strong magnets. MFL tools are often big devices having a diameter that is the same as the diameter of the pipeline and uses sensors all around the tool to measure magnetic flux leakage from the actively magnetized pipeline. Examples of other existing inline inspection ("ILI") techniques include UT, EMAT, and eddy current. These techniques provide alternatives to MFL tools, but suffer from similar disadvantages (e.g. bulky, heavy, same diameter as conduit).

Other magnetics-based approaches to pipeline inspection, such as passive magnetometry techniques like large standoff magnetometry, operate and take measurements from outside the pipeline. Exterior measurement approaches can present issues related to accessing the pipeline for measurement and typically only assess small parts or sections of the pipeline rather than the complete pipeline. Measurements may also be taken farther from the pipeline and only in localized spots along the pipeline.

Existing approaches to fluid conduit inspection can be inconvenient, expensive, require heavy equipment, and may not be suitable or economically affordable for ongoing monitoring. Traditional inspection approaches are typically used every 5 to 7 years, due to cost or convenience issues. Further, such approaches may not be sufficiently adaptable to a variety of types of fluid conduits and may not be useable during pipeline operation.

Accordingly, a system, method, and sensor device for fluid conduit inspection may be desired which overcomes these or other disadvantages of existing approaches to fluid conduit inspection.

SUMMARY

Systems, methods, and devices for fluid conduit inspection using passive magnetometry are provided. A method of inspecting a fluid conduit using passive magnetometry includes collecting magnetic flux data from inside the fluid conduit without actively magnetizing the fluid conduit. The magnetic flux data represents a residual magnetization of the fluid conduit. The method also includes identifying a conduit condition for the fluid conduit using the magnetic flux data.

The fluid conduit may include a ferromagnetic material.

The ferromagnetic material may be any one or more of carbon steel, steel, stainless steel, and cast-iron.

The conduit condition may be an overall condition of the fluid conduit.

The method may further include determining a spread in the magnetic flux data and identifying the overall condition using the spread.

The conduit condition may be a localized anomaly.

The localized anomaly may be a volumetric metal loss.

The method may further include detecting outliers in the magnetic flux data and identifying the localized anomaly using the detected outliers.

The method may further include determining a spread in the magnetic flux data and a median for the magnetic flux data and detecting the outliers in the magnetic flux data using the spread and the median.

The method may further include identifying a conduit feature of the fluid conduit. The conduit feature may include a different magnetic signature than in the rest of the fluid conduit. The conduit feature may be any one or more of a joint, a bend, a schedule change, a casing, a flange, and a valve.

Collecting the magnetic flux data may include collecting a first set of magnetic flux data from inside the fluid conduit and along a length of the fluid conduit and collecting, at a later time, a second set of magnetic flux data from inside the fluid conduit along the length of the fluid conduit. Identifying the conduit condition may include comparing the first and second sets of magnetic flux data.

The second set of magnetic flux data may be compared to the first set of magnetic flux data by automatically aligning or warping the first and second sets onto each other.

A sensor device for collecting magnetic flux data is also provided. The sensor device includes an outer capsule for providing fluid-tight containment to an interior compartment; at least one magnetic sensor housed within the interior compartment for sensing a residual magnetization of a fluid conduit, the sensed residual magnetization being the magnetic flux data; a memory housed within the interior compartment for storing the magnetic flux data; and a communication interface for communicating the magnetic flux data stored in the memory to an external computing device. The sensor device collects the magnetic flux data from inside the fluid conduit without the fluid conduit being actively magnetized.

The sensor device may be free-floating with a fluid in the fluid conduit.

The sensor device may include at least one weight in the interior compartment for adjusting the mass of the sensor device such that the sensor device is neutrally buoyant with respect to a fluid in the fluid conduit.

The sensor device may be attachable to a device configured to travel inside and make sealing contact with the fluid conduit. The sensor device may be attached to the device in such a way that the sensor device is in the center of the fluid conduit. The device may be a cleaning pig.

The sensor device may also include any one or more of an accelerometer, a pressure sensor, an acoustic sensor, and a gyroscope.

A computer system for inspecting a fluid conduit using passive magnetometry is also provided. The computer system includes: a memory for storing magnetic flux data collected from inside the fluid conduit without active magnetization of the fluid conduit, the magnetic flux data representing a residual magnetization of the fluid conduit; and a processor in communication with the memory and configured to generate an electronic representation of a conduit condition for the fluid conduit based on the magnetic flux data, wherein the electronic representation is stored in the memory.

The conduit condition may be a localized anomaly.

The localized anomaly may be volumetric metal loss.

The processor may be further configured to implement an outlier detection algorithm for identifying the localized anomaly using a median magnetic flux value and a magnetic flux spread value.

The conduit condition may be an overall condition of the fluid conduit.

The processor may be further configured to generate magnetic flux spread data representing a spread in the magnetic flux data.

The magnetic spread data may include an interquartile range for the magnetic flux data.

The electronic representation may be a visualization including the magnetic spread data.

The electronic representation may be a visualization indicating a location of the localized anomaly.

The electronic representation may be a visualization displaying a graph of magnetic flux against distance. The graph may plot any one or more of the magnetic flux data, magnetic flux spread data representing a spread in the magnetic flux data, and magnetic outlier data representing outliers in the magnetic flux data.

The processor may be further configured to detect a fluid conduit feature of the fluid conduit. The fluid conduit feature may include a different magnetic signature than in the rest of the fluid conduit. The fluid conduit feature may be any one or more of a joint, a bend, a schedule change, a flange, a valve, and a casing.

The processor may detect the fluid conduit feature using the magnetic flux data.

The processor may detect the fluid conduit feature using any one or more of acceleration data, rotation data, pressure data, temperature data, and acoustic data.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings.

DETAILED DESCRIPTION

Figure 1:
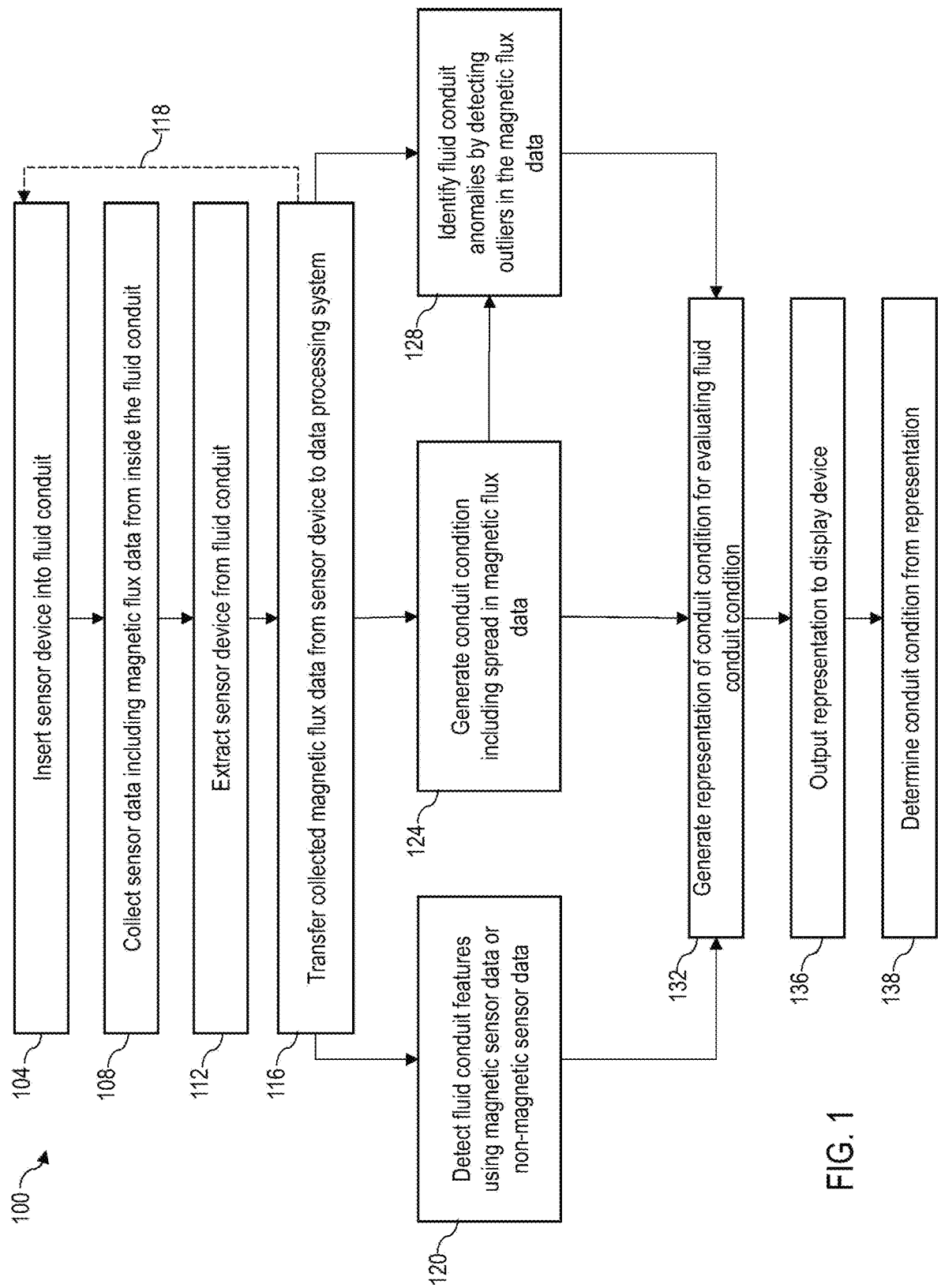
FIG. 1 is a flow chart of a method of fluid conduit inspection using passive magnetometry, according to an embodiment.

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

One or more systems described herein may be implemented in computer programs executing on programmable computers, each comprising at least one processor, a data storage system (including volatile and non-volatile memory and/or storage elements), at least one input device, and at least one output device. For example, and without limitation, the programmable computer may be a programmable logic unit, a mainframe computer, server, and personal computer, cloud based program or system, laptop, personal data assistance, cellular telephone, smartphone, or tablet device.

Each program is preferably implemented in a high level procedural or object oriented programming and/or scripting language to communicate with a computer system. However, the programs can be implemented in assembly or machine language, if desired. In any case, the language may be a compiled or interpreted language. Each such computer program is preferably stored on a storage media or a device readable by a general or special purpose programmable computer for configuring and operating the computer when the storage media or device is read by the computer to perform the procedures described herein.

A description of an embodiment with several components in communication with each other does not imply that all such components are required. On the contrary, a variety of optional components are described to illustrate the wide variety of possible embodiments of the present invention.

Further, although process steps, method steps, algorithms or the like may be described (in the disclosure and/or in the claims) in a sequential order, such processes, methods and algorithms may be configured to work in alternate orders. In other words, any sequence or order of steps that may be described does not necessarily indicate a requirement that the steps be performed in that order. The steps of processes described herein may be performed in any order that is practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article.

The following relates generally to fluid conduit inspection, and more particularly to fluid conduit inspection using passive magnetometry.

In one aspect, the present disclosure provides a method for inspecting a fluid conduit. The method operates without actively magnetizing the fluid conduit. The method includes passively measuring magnetic flux from inside the fluid conduit. The measured magnetic flux is generated by the residual magnetization of a component of the fluid conduit. The magnetic flux measurements are analyzed to determine a spread or variability in the magnetic flux. The spread in magnetic flux is used as an indicator for fluid conduit condition. For example, the magnetic flux spread may be analyzed to determine an overall pipeline condition. Further, the magnetic flux spread may be used along with magnetic flux data to identify anomalies, such as volumetric metal loss, in the fluid conduit by performing outlier detection. Additionally, the magnetic flux measurements may be used to identify conduit features such as joints, bends, and schedule changes.

A system for inspecting a fluid conduit is also provided. The system can implement the above-described method. In an embodiment, the system includes a sensor device and a data processing system. The sensor device collects magnetic flux data from inside the fluid conduit using a magnetic sensor or magnetometer. The sensor device may flow with a fluid in the fluid conduit (e.g. in a liquid line) or may be attached to a device that rides along an interior surface of the fluid conduit (e.g. in a gas line). The magnetic flux data is transferred to the data processing system. The data processing system analyzes the magnetic flux data. Analysis of the magnetic flux data may include generating magnetic flux spread data representing a spread or variability in the magnetic flux data. The data processing system may generate a visualization (e.g. graph) of the magnetic flux spread data which can be presented to and assessed by a human. The visualization may include any one or more of magnetic flux data, magnetic flux spread data, and conduit feature identification data. The visualization may highlight certain features of the visualization, such as the magnetic flux spread, detected outliers or anomalies, or conduit features. The system may further include a display device for displaying the visualization.

Referring now to FIG. 1, shown therein is a method 100 of fluid conduit inspection using passive magnetometry, according to an embodiment.

The method 100 can be used to perform any one or more of identifying a fluid conduit feature, assessing a fluid conduit condition, and detecting and localizing an anomaly in the fluid conduit. By collecting and analyzing passively acquired magnetic flux data from inside the fluid conduit (i.e. from an interior of the fluid conduit), a fluid conduit wall condition can be inferred.

At 104, a sensor device is inserted into an interior of a fluid conduit (i.e. inside the fluid conduit), such as a pipeline. The fluid conduit contains a fluid, which is conveyed by the fluid conduit. The fluid may be a liquid, a gas, or a combination of liquid and gas (e.g. a multiphase flow). The sensor device is transported along a length of the fluid conduit. In cases where the fluid is a liquid, the sensor device may be a free-floating device which can be introduced into the fluid conduit and carried with the fluid. The sensor device may have a neutral buoyancy with respect to the fluid in the fluid conduit. In other cases, the sensor device may be attached to another device, such as a cleaning pig, which rides along an inner surface of the fluid conduit. Deployments in which the sensor device is attached to another device may be used where the fluid is liquid and/or gas.

The sensor device includes a sensor for collecting sensor data and a data storage (e.g. memory) for storing collected sensor data. The sensor includes a magnetic sensor or magnetometer and may also include one or more other sensor types. The sensor device also includes a communication interface for facilitating transfer of sensor data from the data storage of the sensor device to another device (e.g. data processing or data transfer/storage device). The communication interface may be configured to transfer sensor data using wired and/or wireless data transfer techniques.

Generally, the sensor device is configured to collect sensor data as the sensor device runs along a length of the fluid conduit via the sensor subsystem. Collected sensor data can be transferred from the sensor device to an external data processing system via the communication interface for analysis. In an embodiment, the data storage of the sensor device may be read out (e.g. by a memory card reader or the like) to transfer data to the external data processing system. In another embodiment, the sensor device may be configured to actively transfer data to the data processing system.

At 108, the sensor device collects sensor data from the interior of the fluid conduit. The sensor data includes magnetic flux data. The sensor device may record sub-centimeter precision magnetic flux measurements over a length of the fluid conduit. In an embodiment, the sensor device may record 400 measurements per second. In another embodiment, the sensor device may record 1000 measurements per second or more.

The sensor device does not actively magnetize the fluid conduit. The sensor device uses a passive magnetic flux measurement technique which does not make direct contact with the fluid conduit wall.

The sensor device measures the magnetic flux inside the fluid conduit. The magnetic flux is generated by the residual magnetization of the material (e.g. steel) in the fluid conduit walls. This is sometimes referred to as metal magnetic memory (MMM). The residual magnetization is a form of permanent remnant magnetization that occurs in ferromagnetic materials when they are exposed to an external magnetic field. Since Earth produces a weak magnetic field, ferromagnetic materials have some level of magnetism. This is the same physical process that produces permanent magnets (e.g. fridge magnets), but at a much lower strength and it is present in all ferromagnetic fluid conduits.

At 112, the sensor device is extracted from the fluid conduit.

At 116, the collected sensor data, which includes the magnetic flux data, is transferred from the sensor device to a data processing system.

In some embodiments, the sensor data may be transferred to the data processing system by connecting the sensor device directly to the data processing system, such as through a wired or wireless connection. In other embodiments, the sensor data may be transferred to the data processing system indirectly through an intermediary data transfer device. For example, the sensor device may be connected to the intermediary data transfer device via wired or wireless connection and the sensor data transferred to the intermediary data transfer device. The intermediary data transfer device may then transfer the sensor data to the data processing system via wired or wireless connection.

Data transfer from the sensor device to the data processing system (or intermediary device) may occur automatically, for example upon a data transfer-capable connection to the recipient device being established, or manually by a user input. In some cases, the sensor device and/or the recipient device may include a processor configured to automatically transfer or extract sensor data, respectively, from the sensor device to the recipient device when a data transfer connection is established. In some cases, the sensor device and/or the recipient device may be configured to automatically establish the data transfer connection.

Once received by the data processing system, the magnetic flux data (and other sensor data) can be analyzed and various characteristics of the fluid conduit can be determined.

At 118, once the sensor data has been transferred from the sensor device, the sensor device can be inserted into the fluid conduit to collect a second set of sensor data. This can occur at any time after collection of the first set of sensor data. The second set of sensor data may be from the same length or segment of fluid conduit as the first set of sensor data, or may be from a different length or segment of the fluid conduit (or a different fluid conduit). The first and second sets of sensor data (e.g. magnetic flux data) can be compared and changes or differences identified. The comparison may be performed by the data processing system. Differences in the datasets can be used as an indicator of a change in conduit condition (overall or localized). The data processing system may be configured to analyze identified differences in datasets from different measurement runs and determine a predicted cause. The predicted cause may be an anomaly or a feature or may be a particular type of anomaly or feature. This process may include referencing additional data (e.g. reference data 418 of FIG. 4) or may use machine learning techniques detect and/or classify the differences.

Datasets collected at different times along the same segment of the fluid conduit (i.e. from different measurement runs) may be compared by automatically aligning or warping the datasets onto each other. The comparison process may include identifying a dataset from a first measurement run as a "baseline" dataset. Datasets from subsequent or follow-up runs may also be stored as historical data and used for comparison purposes in addition to the baseline dataset. Data from one or more measurement runs can be compared to the baseline dataset or to historical datasets including the baseline dataset and all or a subset of other historical datasets from subsequent measurement runs. Changes across datasets can be tracker over time. In follow up runs to acquire additional datasets (i.e. after the baseline), the distance does not have to be created and the analysis does not have to start from scratch. Subsequent datasets can be aligned to the baseline, and potentially any additional datasets from previous measurement runs, for comparison and tracking over time.

The sensor device that collects the second set of sensor data may be the same sensor device that collects the first set of sensor data or a different (i.e. second) sensor device. Whether the same sensor device is used to collect the second (or third, fourth, etc.) set of sensor data may depend on a power capacity of the sensor device. For example, in an embodiment, the sensor device includes a power source comprising a one-time use battery. The sensor device may be reused (i.e. reinserted into the fluid conduit to collect the second set of sensor data) if the battery has remaining power. On the other hand, a user may not want to risk comprising the integrity of the device and its data collection in such a scenario and may instead use a second sensor device to collect the second set of sensor data.

The data collected by the sensor device is highly repeatable. This factor may allow the method 100 and the systems described herein to be particularly advantageously through the use of multiple measurement runs as described herein. The sensor device of the present disclosure may be used more often than other inspection techniques due to its ease of deployment. Frequency of deployment and data collection may be determined by the particularities of the conduit, risk level, failure expectation, or other factors. Data collected from measurement runs can be stored and future runs can be compared against data from all previous runs. Accordingly, the method 100 may advantageously be able to provide conduit operators with information on the conduit condition more often than traditional tools. For example, traditional tools are typically run every 5 to 7 years, assuming the tool can be run at all in the particular conduit. In contrast, the method 100 may be used to perform inspection every half year or year, for example, with minimal disruption to operations.

At 120, the sensor data is analyzed to identify fluid conduit features. The sensor data includes the magnetic flux data. The sensor data may also includes any one or more of acceleration data, rotation data, acoustic data, and pressure data. Identified fluid conduit features may be stored as conduit feature data. Conduit feature data may include a feature type (e.g. joint, bend, schedule change) and a feature location (e.g. 510*m*). The conduit feature data may also include a feature condition (e.g. good, bad, etc.).

The terms "fluid conduit feature" and "conduit feature", as used herein, refer to physical characteristics of the fluid conduit. The conduit feature includes a magnetic signature that is different from the rest of the fluid conduit. The unique or different magnetic signature associated with the fluid conduit feature is detectable via the data processing system. The data processing system may detect the unique magnetic signature and determine a fluid conduit feature type from the magnetic signature, for example by referencing a database of magnetic signatures linked to conduit feature types or via a machine learning model which receives a magnetic signature as input and outputs a fluid conduit feature type. Conduit features may include, for example, joints, bends, schedule changes, welds (e.g. girth welds), wall thickness changes, casings, steel bores, flanges, valves, and elevation changes.

Detecting the fluid conduit features may assist fluid conduit inspection as described herein. In some cases, such as where drawings of the fluid conduit (e.g. pipeline) are not available, the presence of certain conduit features may be unknown and their identification can provide information about their existence. This may be the case, for example, where the features are not visible from the outside of the fluid conduit, such as where the feature is on the inside the fluid conduit or the fluid conduit is buried (e.g. underground pipeline). Identifying the features may also help confirm distance/location accuracy of the sensor device. Further, once identified, features can be analyzed by the fluid conduit inspection system (e.g. via data processing system 236 of FIG. 2 or data processing system 400 of FIG. 4). In an embodiment, a data processing system detects a feature (e.g. weld) and determines a condition for the feature (e.g. good, bad, etc.). The data processing system may include a database storing data signatures (derived from the sensor data) linked to associated feature conditions. For example, a detected weld having a data signature X may be linked in the database to a good weld condition. Accordingly, the data processing system can query the database using the signature (which is derived from the sensor data) and determine a feature condition for the detected feature. The determined feature condition can be outputted via a display to a user.

A fluid conduit joint may be detected by identifying sudden and sharp changes (e.g. spikes) in the magnetic flux data. A "joint" as used herein includes a connection between two continuous pieces of fluid conduit. A joint may include two spools joined together using any suitable method of joining. Examples of joints include welds and flanges. Welds and flanges are common joints in steel pipelines. A "weld" as used herein refers to a specific form of joint which includes two spools welded together to join.

A fluid conduit joint may be detectable using acceleration data and rotation data collected by the sensor device. The joint may include a weld bead (e.g. in a steel conduit). When the sensor device is deployed on a device that travels along an inner surface of the fluid conduit (e.g. cleaning pig), the pig (and the sensor device attached thereto) may vibrate as it passes over the joint. The vibration can be measured by the acceleration and rotation of the pig (and sensor device). Acceleration and rotation measurements are collected by the sensor device and stored as acceleration data and rotation data.

A fluid conduit schedule change or casing may be detected by identifying distinct structures with paired spikes and a change in the magnetic flux between them. A change in the magnetic flux surrounded by large spikes may be used to indicate the start and end of the schedule change.

"Schedule" is the pipeline term for wall thickness (e.g. schedule 40 represents a thinner wall than schedule 80). Throughout the present disclosure, use of the term "schedule" or "schedule change" is used to refer to all fluid conduit types and not only pipelines. Depending on the outer diameter of the conduit, a schedule 40 is a certain wall thickness (e.g. for a 3.5 inch OD line, schedule 40 means a 0.216 inch wall, while for an 8.625 inch OD pipeline, schedule 40 means a 0.322 inch wall). In steel pipelines, the outer diameter is always the same, so a thicker wall results in a thinner inner diameter.

A "casing" as used herein is an additional layer of conduit (e.g. pipe) around the standard conduit (e.g. pipe). Casings may typically be found at river or road crossings. As the casing is on the outside of the pipe, the casing does not change the inner diameter of the conduit.

A fluid conduit schedule change may be detected using pressure data collected by the sensor device. For example, when the sensor device is deployed on a pig or similar device, changes in the back pressure required to push the pig may be used as an indicator of a schedule change. The collected pressure data can be analyzed for changes in the back pressure required to push the pig, and a schedule change may be inferred therefrom.

A fluid conduit elevation change may be detected using pressure data collected by the sensor device.

A fluid conduit bend may be detected using rotation data collected by the sensor device (e.g. via a gyroscope). For example, a device such as a pig travelling along an inner surface of the fluid conduit may experience rotation when the device travels along a bend. Accordingly, when the sensor device is deployed on a pig or similar device, a fluid conduit bend may be detected by analyzing the rotational data for rotational features indicative of a bend.

A fluid conduit bend may be detected using the magnetic flux data. A fluid conduit bend may correspond to an increase in magnetic flux (as demonstrated by data described herein). For example, the magnetic flux data may be analyzed for increases in magnetic flux and a bend may be inferred therefrom. The bend information inferred from the magnetic flux data may be limited to a bend location (and not an angle or radius).

At 124, the magnetic flux data is analyzed to determine a spread or variation in the magnetic flux (or "magnetic flux spread"). The term "spread", as used herein, refers to the statistical concept and technique, which may also be known as "statistical dispersion" or "variability". The magnetic flux spread may be quantified by determining an interquartile range (IQR). The magnetic flux spread may represent a relative spread in the magnetic flux.

The magnetic flux spread data can be used as an indicator for making a fluid conduit condition determination.

At 128, the magnetic flux data is analyzed to identify potential fluid conduit anomalies or defects that may threaten performance or safety of the fluid conduit. Anomalies may include, for example, volumetric metal loss, presence of access material at joints, or the like.

Anomalies may be detected by identifying outliers in the magnetic flux data using an outlier detection technique (e.g. one or more outlier detection algorithms). The outlier detection technique may consider magnetic flux spread data. In an embodiment, an outlier detection algorithm is used that is based on the median magnetic flux and magnetic flux spread data (e.g. IQR).

The outlier detection algorithm may be configured to detect metal loss in the fluid conduit.

The outlier detection algorithm may be configured to identify areas with a high density of pitting corrosion or areas with larger general corrosion.

In an embodiment, the outlier detection algorithm is configured to detect volumetric metal loss.

In another embodiment, the outlier detection algorithm detects external corrosion in the fluid conduit. The outlier detection algorithm may use increases in the spread of the magnetic flux measurements in localized areas as an indicator of external corrosion. In such a case, the magnetic flux spread data may be analyzed to detect spread increases in localized areas of the fluid conduit. The localized area of the fluid conduit can be identified or labeled as a potential site of external corrosion.

The outlier detection algorithm may detect outliers in the magnetic flux data based on the structure of the magnetic flux.

The outlier detection algorithm may be configured to not use larger, smoother structures in the magnetic flux data as an indicator for metal loss.

The outlier detection algorithm may be configured to identify magnetic flux measurements which have unusually high or unusually low magnetic flux The outlier detection algorithm may be configured to identify or detect sharp spikes or rapid fluctuations in magnetic flux data. Sharp spikes or rapid fluctuations in the magnetic flux may, for example, be used as an indicator of metal loss in the fluid conduit wall.

At 132, any one or more of magnetic flux data (magnetic flux measurements), conduit feature data, magnetic flux spread data, and outlier detection data may be provided as input to generate a visualization. The visualization presents the analyzed data (all or a subset) in a human-readable format such that a human can review the data and consider subsequent action.

The visualization may be a graphical user interface displayable at a display of a computing device. The visualization may be an electronic report.

The visualization may include one or more graphs displaying raw or processed sensor data. In an embodiment, the visualization includes a graph plotting magnetic flux data (magnet flux measurements) against distance. The graph also includes magnetic spread data overlaid on the plot.

The visualization may highlight detected outliers and conduit features.

The visualization of the magnetic flux data can be analyzed to determine an overall fluid conduit condition.

At 136, the visualization(s) generated at 132 is outputted to a display device. The display device may be a display device of the data processing system, the intermediary data transfer device, or other computing device such as a mobile device, desktop, tablet, smartphone, or the like.

At 138, a conduit condition is determined using the representation. The condition may be determined by a human, such as a pipeline operator, viewing the representation on the display device. In other embodiments, the condition may be determined by a machine (i.e. a computer system). For example, the representation may be provided as input to automated computer-implemented process such as a computer program, algorithm, or a machine learning model, which determines a conduit condition through further processing or analysis. In an embodiment, the algorithm, which may include a machine learning model, may receive data stored in the system as an input and generate an output which can be used to generate a visualization.

The method 100 may provide a high-frequency screening tool for fluid conduits. The method 100 may be used in-between MFL runs or as a stand-alone technique for fluid conduits that cannot be inspected with traditional MFL tools or for which MFL inspection is not commercially viable. The method 100 may optimize pipeline inspection programs, reduce pipeline downtime, and increase profits for pipeline operators.

Figure 2:
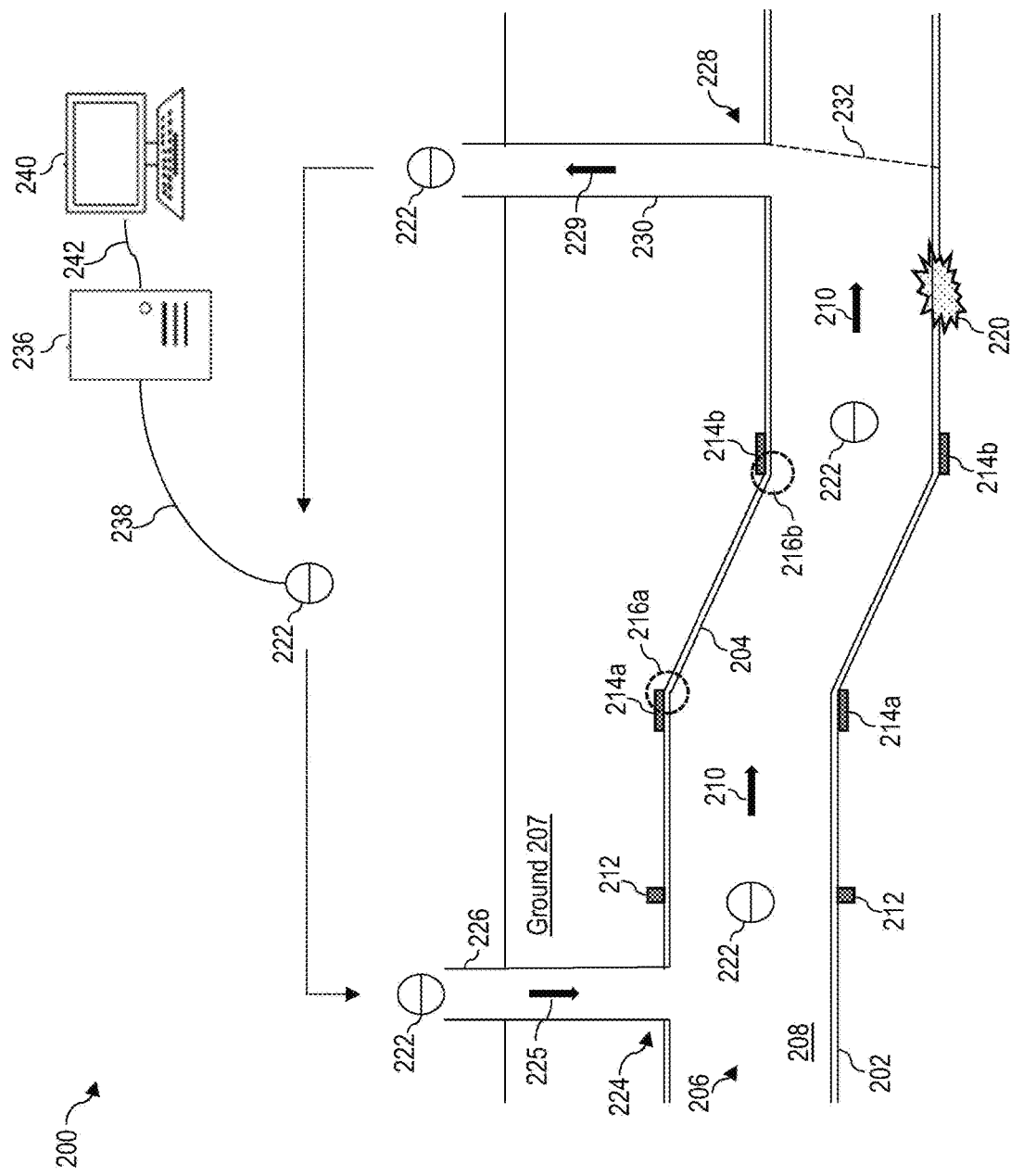
FIG. 2 is a schematic diagram of a fluid conduit inspection system implementing the method of FIG. 1, according to an embodiment.

Referring now to FIG. 2, shown therein is a schematic illustration of a fluid conduit inspection system 200 implementing the fluid conduit inspection method 100 of FIG. 1, according to an embodiment.

The system 200 includes a fluid conduit 202. Only a portion of the fluid conduit 202 is shown in FIG. 2.

The fluid conduit 202 includes a fluid conduit wall 204 which encloses a fluid conduit interior 206. The conduit interior 206 (also referred to herein as "inside the fluid conduit" or "the inside of the fluid conduit") refers to a space enclosed by the fluid conduit wall 204.

The fluid conduit 202 includes a ferromagnetic material. The ferromagnetic material may be any ferromagnetic material used for pipe wall or fittings. The ferromagnetic material may be any one or more of steel, stainless steel, carbon steel, and cast iron. The ferromagnetic material may be the fluid conduit wall 204, or a layer, portion, or component thereof. The ferromagnetic material may be a fluid conduit feature, such as a joint (e.g. joints 214a, 214b below) that is a component of the fluid conduit 202. The fluid conduit 202 may be composed entirely or partially of a ferromagnetic material. The fluid conduit 202 may be partially ferromagnetic (e.g. a non-metallic conduit) with one or more metallic conduit features (e.g. joints, tees, etc.). The fluid conduit 202 may comprise multiple layers where only a subset of the layers includes ferromagnetic material. For example, the fluid conduit 202 may include ferromagnetic material only at fluid conduit features, such as joints or tees (e.g. a non-metallic pipeline having steel joints or tees). The fluid conduit wall 204 may include ferromagnetic material. The fluid conduit wall 204 may be composed, for example, of any one or more of steel, stainless steel, carbon steel, cast iron, flexsteel, HDPE, fiberspar, ductile iron.

In the present example of system 200, the fluid conduit 202 is located below ground 207. In other examples, the fluid conduit 202 may be located above ground may have above ground and below ground segments.

The interior 206 of the fluid conduit 202 holds and conveys a fluid 208. The fluid flows along a direction of flow 210. The fluid 208 may be a liquid, a gas, or a combination of liquid and gas (e.g. multiphase flow). The fluid 208 may be, for example, crude oil, oil emulsion, natural gas, sour gas, produced water, or fresh water.

The fluid conduit 202 includes a plurality of conduit features. The conduit features include a weld 212, joints 214a and 214b, and bends 216a and 216b.

The fluid conduit 202 includes an anomaly 220. The anomaly 220 may be a volumetric metal loss, a deposit, a leak, etc. A deposit is inside the conduit and not part of the wall 204.

The system 200 also includes a sensor device 222 for collecting magnetic flux data from the interior 206 of the fluid conduit 202.

The sensor device 222 may be for example the sensor device of United States Patent Application Publication No. US20180171783A1, Ser. No. 15/843,310, United States Patent Application Publication No. US20180177064A1, Ser. No. 15/843,296, which are hereby incorporated by reference in their entirety.

The sensor device 222 includes a sensor component, a data storage component, and a communication interface for transferring data from the sensor device. The sensor component includes a magnetometer for collecting the magnetic flux data. The sensor component may include additional sensors such as any one or more of an accelerometer, a pressure sensor, a gyroscope, an acoustic sensor, and a temperature sensor.

In some cases, the sensor device 222 may measure magnetic flux of the Earth magnetic field. Such an approach may be used, for example, in cases where the fluid conduit 202 is non-metallic.

The sensor device also includes a memory housed within the interior compartment for storing the magnetic flux data and an internal connector for communicating the magnetic flux data stored in the memory to an external computing device.

The system 200 includes a sensor device insertion point 224 for inserting the sensor device 222 into the fluid conduit 202 along insertion direction 225. The insertion point 224 includes a device guide 226 for guiding the sensor device 222 into the fluid conduit interior 206 at the start of a measurement run. The device guide 226 may be continuous with the fluid conduit interior 206 such that insertion of the sensor device 222 into the device guide 226 facilitates insertion of the sensor device 222 into the fluid conduit 202. The device guide extends from the fluid conduit wall 204 at the insertion point 224 to a location above ground 207.

The system 200 includes a sensor device extraction point 228 for extracting the sensor device 222 from the fluid conduit 202 along extraction direction 229. The extraction point 228 includes a device guide 230 for guiding the sensor device 222 out of the fluid conduit interior 206 at the end of a measurement run. The device guide 230 may be continuous with the fluid conduit interior 206 such that the sensor device 222 can be extracted from the fluid conduit 202. The device guide extends from the fluid conduit wall 204 at the extraction point 228 to a location above ground 207.

In other embodiment, the sensor device 222 may be inserted and extracted using different insertion and extraction techniques.

The system 200 includes a device stopping mechanism 232 for stopping the flow of the sensor device 222 while permitting the continued flow of the fluid 208 in the fluid conduit 202 along flow direction 210. The device stopping mechanism is positioned in the interior 206 of the fluid conduit 202 at or near the extraction point 228. Once stopped, the sensor device 222 can be more easily removed at the extraction point 228.

The distance from the insertion point to the extraction point may constitute a measurement run when traveled by the sensor device 222. The sensor device 222 may perform multiple measurement runs (e.g. first measurement run, second measurement run, etc.). Similarly, a second sensor device may be inserted into the fluid conduit 202 to perform one or more measurement runs. In some cases, measurement runs of multiple sensor devices 222 may overlap in that the multiple sensor devices 222 may be in the fluid conduit 202 at the same time but at different points along the measurement run.

The system 200 also includes a data processing system 236. The data processing system includes a memory storing computer-executable instructions (e.g. software) that, when executed by a processor of the data processing system, cause the data processing system to perform various data analysis and visualization functions described herein.

Once the sensor device 222 is extracted from the fluid conduit 202, the sensor data (which includes the magnetic flux data) stored in memory of the sensor device 222 is transferred to the data processing system 236. In some cases, the sensor data may be transferred to the data processing system 236 indirectly through an intermediary data transfer device (not shown), which may temporarily store the transferred sensor data.

To facilitate sensor data transfer, a data transfer connection 238 is established between the sensor device 222 and the data processing system 236. The data transfer connection 238 may be wireless (e.g. WiFi, Bluetooth) or wired (e.g. data transfer cable, USB). The sensor device 222 may be connected to the data processing system 236 via a network, such as a local area network or wide area network (e.g. the Internet).

The sensor data is transferred from the sensor device 222 to the data processing system 236 via the data transfer connection 238. The transfer may initiate automatically or may require a user input.

The data processing system 236 analyzes the received sensor data to perform any one or more of determining a spread for the magnetic flux data, determining an overall fluid conduit condition (e.g. using the spread), detecting potential anomalies (e.g. via outlier detection on the magnetic flux data), and identifying conduit features. Processing may be automatic or manual (e.g. developing code).

The data processing system may implement one or more outlier detection algorithms for detecting outliers in the magnetic flux data that correspond to a localized anomaly or a conduit feature. For example, an outlier detection algorithm may be configured to identify outliers in the magnetic flux data that correspond to volumetric metal loss. In another example, an outlier detection algorithm may be configured to identify outliers in the magnetic flux data that correspond to any one or more of a steel bore, a casing, a weld, a flange, and a valve. In an embodiment, the outlier detection process may be automated. The outlier detection process may be automated using a machine learning model that has been configured (e.g. trained) to receive magnetic flux data as an input (e.g. at input layer of neural network), recognize signatures or signals in the magnetic flux data that indicate or suggest a particular anomaly or feature, and generate a prediction as an output (e.g. at output layer of a neural network). In an embodiment, the machine learning model includes a classifier configured to assign a class label to a particular data item. The class label may be an anomaly type, such as metal loss or access material. The class label may be a feature type, such as joint, valve, flange, etc. In another embodiment, the machine learning model may include multiple classifiers. For example, the machine learning model may include a first classifier for classifying an outlier as an anomaly or a feature. Depending on the class assignment, the data may be provided to a second classifier for determining an anomaly type or a feature type. Training and retraining the machine learning models, including the generation of training datasets, may include manually labelling data samples using confirmation via field results (e.g. operators digging up the conduit or knowing the line condition at certain locations).

The data processing system 236 generates a conduit inspection output. The conduit inspection output may be a user interface including a visualization or other representation of the data which is presented at a display device 240. The display device 240 is communicatively connected to the data processing system 236 via a data transfer connection 242. The display device 240 may be a display of the data processing system 236 or may be a separate device including a display. The display 240 may be configured to present an online interface or electronic document (e.g. PDF).

The sensor device 222 is free-floating and flows with the fluid flow 210. The sensor device 222 may be designed or configured to be neutrally buoyant in the fluid 208. For example, the sensor device 222 may include a weight for adjusting the mass of the sensor device so the sensor device is neutrally buoyant in the fluid 208. The characteristics of the weight, including whether or not one is used, may depend on the configuration needed for the density of a particular liquid in the fluid conduit 202.

In other embodiments, the sensor device 222 may be attached to a device, such as a cleaning pig, which travels along an inner surface of the fluid conduit wall 204. The device may be configured to travel inside and make sealing contact with the fluid conduit 202. The sensor device 222 may be attached to the device in such a way that the sensor device is in the center of the fluid conduit 202. The term "center" as used in this context refers to a position within the fluid conduit interior 206 where the sensor device 222 has the same or approximately the same distance to each part of the fluid conduit wall 204 in that section of the fluid conduit 204. The center may be at or near the geometrical center. The sensor device 222 and attached device may be, for example, the sensor device and inspection system of United States Patent Application Publication number US2019/0368665A1, Ser. No. 16/424,643, which is hereby incorporated by reference in its entirety.

The sensor device 222 measures magnetic flux (not shown) inside the fluid conduit 202 which is generated by the residual magnetization of the fluid conduit 202. The residual magnetization results from exposure of the fluid conduit 202 (i.e. the fluid conduit wall material) to an external magnetic field (e.g. Earth's weak magnetic field).

The magnetic flux present in the fluid conduit 202 may be a result of a combination of factors which depend on the entire history of the fluid conduit and may go all the way back to the manufacturing of fluid conduit wall 204 materials (e.g. pipe spools) before shipment for a construction project.

For example, differences in seam type (seamless, longitudinal or spiral seam pipe), grade, or wall thickness lead to differences in the measured magnetic flux. Then, during construction, the heat from welding and stresses from the cold-working of field bends, for example, can increase the magnetic flux in a pipeline at those locations. Finally, changes to the pipeline during the operation of the line can affect the magnetic flux in the line which could include any repairs, (magnetic) inspections, corrosion, or applied stresses. All these factors produce a pipeline magnetization which shows complex structure and can be difficult to precisely assess without any baseline information on the pipeline and its history.

In practice, however, it is observed that the magnetic flux in pipelines shows repeatable patterns and structures (i.e. most pipelines have similar looking magnetic flux) and the magnetic flux that is measured does not change over time unless it is either magnetized by an MFL tool or other magnetic source or the line changes due to degradation of the line's condition (e.g. metal loss from corrosion). Repeated future measurements of a line are therefore expected to even better identify changes in a fluid conduit 202's magnetic flux and baseline data (from previous screenings) can be used to more accurately and precisely assess changes in the fluid conduit 202 condition (where changes would generally indicate corrosion or other pipeline anomalies). As larger volumes of data are acquired, it becomes possible to accurately label features and anomalies present in a pipeline during an initial screening.

Figure 3:
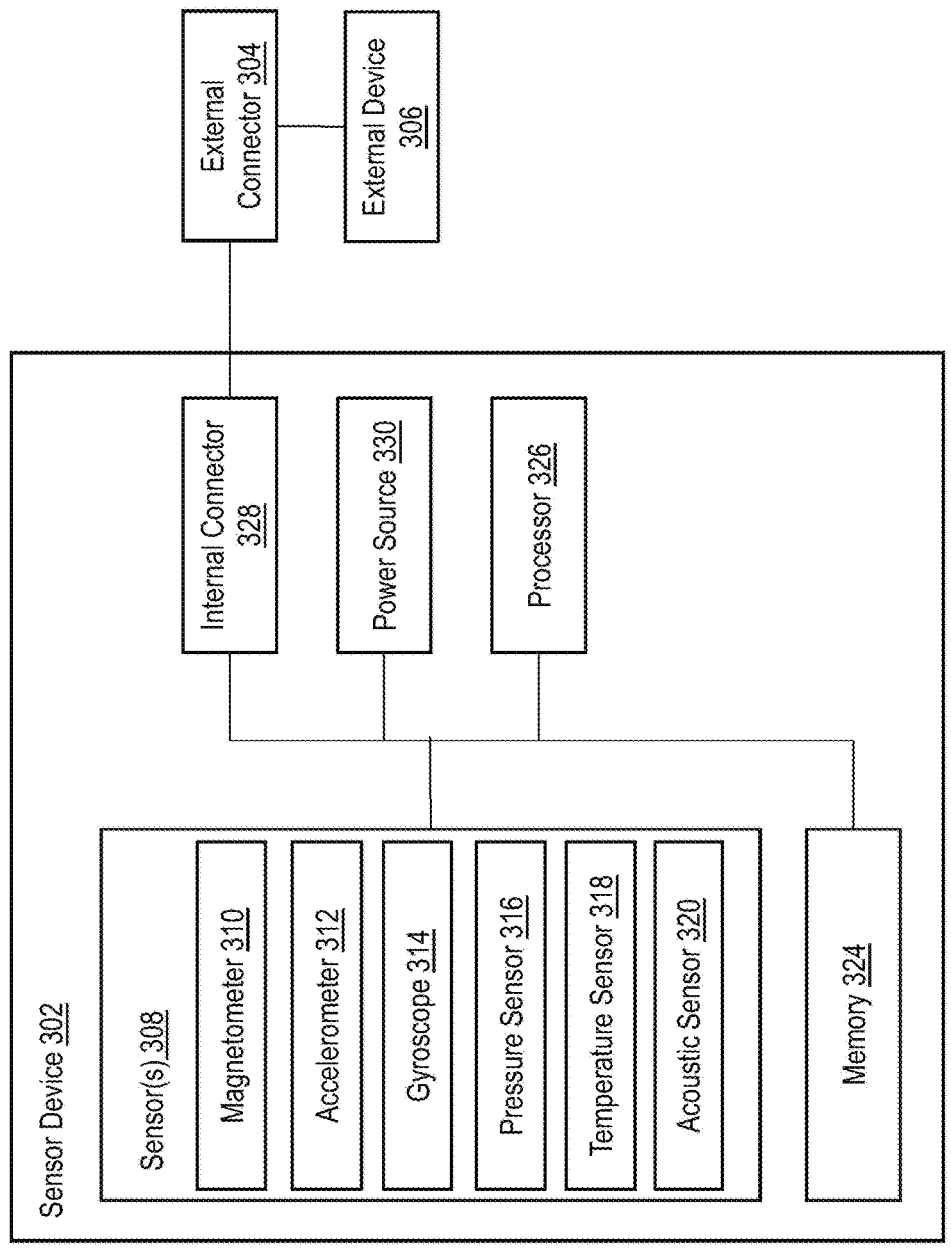
FIG. 3 is a block diagram of a sensor device for collecting magnetic flux data from an interior of a fluid conduit, according to an embodiment.

Referring now to FIG. 3, shown therein is a system 300 for fluid conduit inspection, according to an embodiment.

The system 300 includes a sensor device 302 for collecting sensor data including magnetic flux data from inside a fluid conduit. The sensor device 302 may be the sensor device 222 of FIG. 2.

The system also includes an external connector 304 for communicating with an external device 306 such as the data processing system 236 of FIG. 2 or an intermediary data transfer device. The external connector 304 may be a cradle configured to receive the sensor device, a cable (e.g. USB cable), a memory card reader for receiving a memory card installed on the sensor device, or any other means known in the art for transmission of data. In other embodiments, the system 300 may not include the external connector 304 and data transfer may occur directly between the sensor device 302 and the external device 306 via a wireless communication (e.g. wireless readout via wireless communication method).

The sensor device 302 includes a sensor 308 for taking measurements about a property of the fluid or fluid conduit from inside the fluid conduit.

The sensor 308 includes a magnetometer 310. The magnetometer 310 may be a triaxial magnetometer. The magnetometer 310 collects measurements of magnetic flux from inside the fluid conduit.

The sensor 308 may also include any one or more of a triaxial accelerometer 312, a triaxial gyroscope 314, a pressure sensor 316, a temperature sensor 318, and an acoustic sensor 320.

In other embodiments, the sensor 308 may include other sensors, such as an ultrasonic sensor, as well.

In other embodiments, the sensor device 302 can have more than one of each of the accelerometer 312, gyroscope 314, magnetometer 310, pressure sensor 316, temperature sensor 318 and acoustic sensor 320. For example, when the sensor device 302 has multiple accelerometers 312 and gyroscopes 314, the measurement errors caused by, e.g., rotation of the sensor device 302 about its own axis, tipping over or capsizing of the sensor device 302, etc., can be reduced, compensated for, or cancelled out.

In an embodiment, the acoustic sensor 320 is not integrated with the main architecture of the sensors 308 and may be connected directly to a dedicated acoustic processor which amplifies, digitizes, and compresses the data and writes it to a dedicated memory, there being at least two memories in the system. The acoustic dedicated processor may be operatively connected to processor 326.

The sensor device 302 includes a memory 324 for storing measurements taken by the sensor(s) 308. The measurements include magnetic flux data.

The memory 324 may be any suitable form of data storage. In an embodiment, the memory 324 may include 1 Gb of Serial NOR Flash Memory. In other embodiments, the memory 324 may include other forms and sizes of computer-readable memory. The memory 324 may also be removable and/or swappable. For example, the memory 324 may be an SD or microSD card fitted to an appropriate interface.

The memory 324 may receive data directly from the sensor 308, or the memory 324 may communicate with sensor 308 via a processor 326.

When the memory 324 is full, the memory 324 may shut down the sensor device 302 automatically by signaling the memory status to the processor 326.

The sensor device 302 may have more than one memory 324. For example, the acoustic sensor 320 may have a dedicated memory of its own while the rest of the sensors may share another memory.

The sensor device 302 includes at least one internal connector 328 for communicating with the external device 306. The internal connector 328 connects the sensor device via wired or wireless connection to external devices (e.g. external connector 304, external device 306) for data transfer and communication. The internal connector 328 may be a communication interface for data communications with the external device 306. Accordingly, the internal connector 328 may communicate or transfer data stored in the memory 324 (e.g. sensor data, magnetic flux data) to the external device 306 The internal connector 328 may be a USB port. In an embodiment, the internal connector 328 may be a micro HDMI which connects to a USB (e.g. external connector 304).

The internal connector 328 is electrically connected to the processor 326. When the sensor device 302 is interfaced with the external connector 304, the processor 326 can be connected to the external device 306.

The sensor device 302 includes a power source 330 for providing power to the components of the sensor device 302. The power source 330 provides stored power to perform continuous measurements by the sensor 308. For example, the power source 330 may be a 3.7V lithium polymer rechargeable battery with approximately 165 mAh in charge which provide continuous sensing for around one hour or more. When the power source 330 is low on stored power, it may turn off the sensor device 302 automatically by sending a signal to the processor 326. The power source 330 may be chargeable through a set of conductors using an activator unit.

The power source 330 may be charged using the internal connector 328, and charging may occur when the sensor device 302 is interfaced with a cradle (which acts as a charging source and may include a data storage and facilitate transfer of the sensor data from the memory 324 to the cradle). The power source 330 may be charged by USB power.

The power source 330 may be chargeable through a set of conductors with an activator unit or it may be charged through the internal connector 328 interfacing with the external connector 304. The charging circuitry may be within the external connector 304.

The sensor device 302 includes the processor 326 for performing logical operations. The processor 326 may include more than one processor. For example, the acoustic sensor 320 or magnetometer 310 may have a dedicated processor while the rest of the sensors within the sensor 308 may share another processor. The processor 326 may be an ATxmega128A4U-CU processor manufactured by Atmel. The processor 326 may be reprogrammable (e.g. using instructions from external device 306) to change the capabilities and configuration of sensor device 302.

The processor 326 may be programmed to set the rate at which data is captured by sensor 308, and/or the time the sensor device 302 should wait before beginning to collect data using sensor 308. The processor 326 may also accept instructions to change the range of values that the sensor 308 should measure, and the number of bits that should represent each measurement. In other embodiments, an appropriate general purpose processor (or a combination of such processors) may be used for the processor 326, and other instructions could be accepted by the processor 326. The processor 326 may also instead be implemented as a state machine to simplify the design and/or power consumption of sensor device 302.

The external device 306 may be a general purpose computer that includes a USB port. In other embodiments, other ports can be used, depending on the ports available on an intermediary data transfer device. The external device 306 may be configurable to accept data from the sensor device 302 by way of the internal connectors 326. The external device 306 may include an interface for interfacing directly with the conductors 326 (e.g. jumper headers, an RS-232 serial port, a FireWire port, a USB port, etc.). The external device 306 may be able to instruct the processor 326 to erase data stored in the memory 324 (i.e. to make space for future data).

Figure 4:
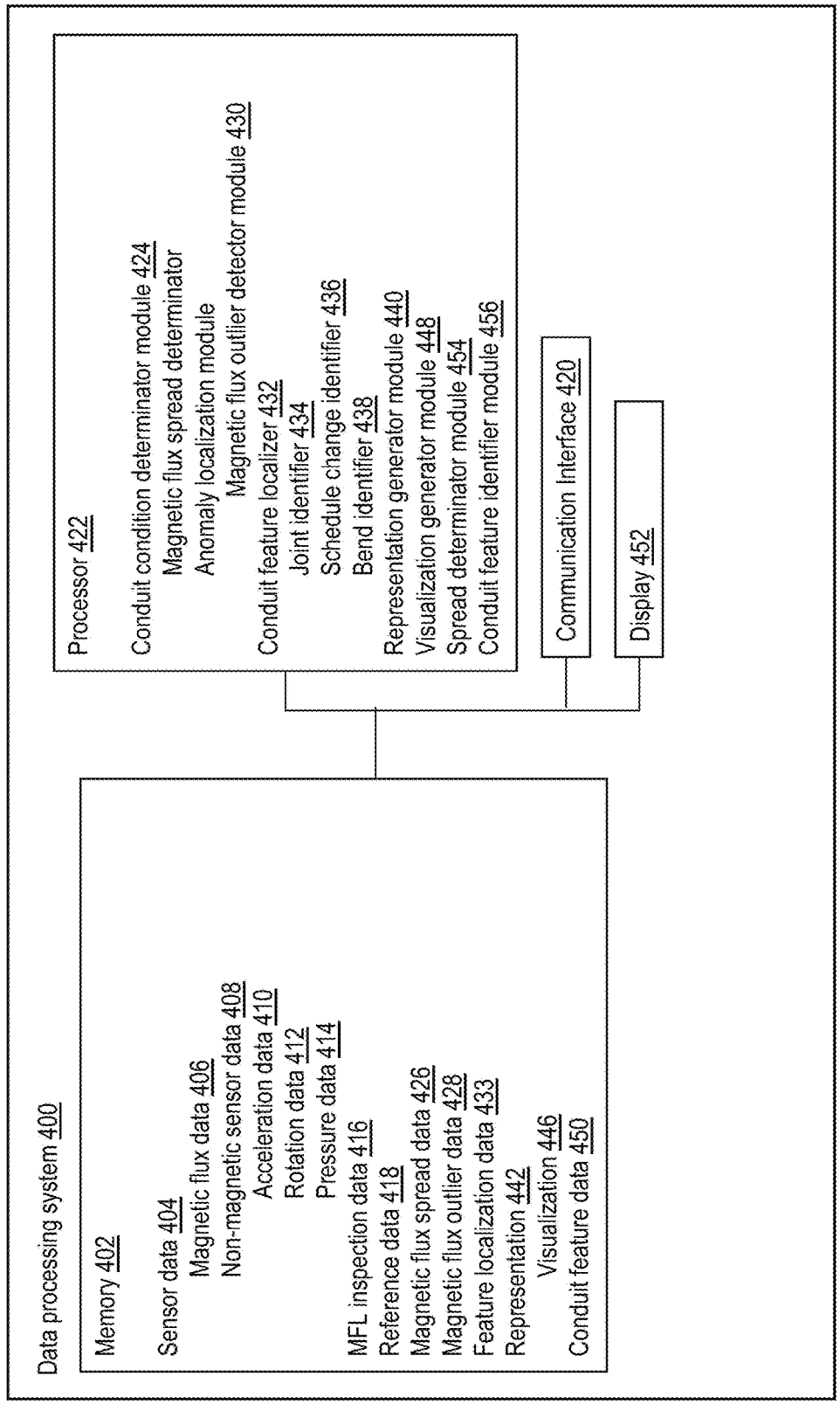
FIG. 4 is a block diagram of a data processing system for analyzing magnetic flux data collected from an interior of a fluid conduit, according to an embodiment.

Referring now to FIG. 4, shown therein is a data processing system 400 for analyzing magnetic flux data collected from inside a fluid conduit, according to an embodiment. The data processing system 400 may be the data processing system 236 of FIG. 2 or the external device 306 of FIG. 3.

The data processing system 400 includes a memory 402 for storing sensor data 404. The sensor data 404 is collected from inside a fluid conduit, such as a pipeline.

The sensor data 404 includes magnetic sensor data 406 (or magnetic flux data 406). The magnetic sensor data 406 includes magnetic flux measurements taken from inside of a non-actively magnetized fluid conduit. In other words, the magnetic sensor data is passively acquired magnetic flux data from measurements of magnetic flux in the fluid conduit resulting from residual magnetization.

The sensor data 404 may also include non-magnetic sensor data 408. The non-magnetic sensor data 408 includes measurements of non-magnetic physical properties taken from inside the fluid conduit. The non-magnetic sensor data 408 may be used on its own for analysis or may be provided in support of analysis performed on the magnetic sensor data 406. The non-magnetic sensor data 408 may include acceleration data 410, rotation data 412, and pressure data 414. In other embodiments, the non-magnetic sensor data 408 may include, for example, acoustic data or temperature data.

The sensor data 404 may have been collected by a free-floating or neutrally buoyant sensor device flowing with the fluid in the fluid conduit or by a sensor device attached to a device which travels along an inner surface of the fluid conduit (e.g. cleaning pig).

The sensor data 404 includes position or location data that can be used to map a particular measurement to a particular location of the fluid conduit. The position data can provide a location for further investigation or remedial action.

The sensor data 404 may also include identifier information, such as a conduit identifier (or conduit segment identifier) for identifying the fluid conduit from which the sensor data 404 was collected and a measurement run identifier (e.g. number, name, date, time) for identifying the particular measurement run during which the sensor data 404 was collected. The conduit identifier, such as a unique name or number, can be used when the system 400 analyzes data from multiple fluid conduits. The measurement run identifier can be used when the system 400 analyzes data from multiple measurement runs of the same fluid conduit.

The memory 402 may store magnetic flux leakage (MFL) inspection data 416 for comparison with the processed sensor data 404. The MFL inspection data 416 may represent MFL measurements taken for a fluid conduit for which sensor data 404 has also been collected.

The memory 402 may also store reference data 418. The reference data 418 may improve the ability of the system 400 to perform fluid conduit inspection and provide useful information to users. The sensor data 404 may be analyzed using the reference data 418. The reference data 418 may include historical sensor data that has been previously collected and analyzed. The reference data 418 may include training data for training a machine learning ("ML") model for via a supervised or unsupervised learning technique. In cases of supervised learning, the training data may include class labels classifying the data (e.g. machine labelled such as with an existing ML model; or human labelled). In some cases, the reference data 418 may include threshold data generated from historical sensor data. For example, historical sensor data may be used to determine one or more thresholds which can then be used as a reference against which newly collected sensor data 404 can be evaluated.

The data processing system 400 includes a communication interface 420 for receiving the sensor data 404. The sensor data 404 may be received directly from the sensor device or from an intermediary data transfer device storing the sensor data 404.

The data processing system 400 includes a processor 422.

The processor 422 includes a conduit condition determinator module 424 for determining an overall condition of the fluid conduit.

The spread determinator module 424 is configured to receive the magnetic flux data 406 and determine a spread in the magnetic flux data. In an embodiment, the spread may be quantified by determining an interquartile range (IQR). The determined spread is stored as magnetic flux spread data 426. The spread may be represented as a value in Gaussian units or Gs (e.g. an IQR of 0.24 Gauss). In some cases, multiple spread values may be determined for multiple subsets of the magnetic flux data.

The magnetic flux spread data (i.e. the spread value) can be used as an indicator for overall conduit condition. For example, a lower spread value (e.g. IQR) can be correlated with a better conduit condition, while a higher spread value can be correlated with a worse conduit condition.

Advantageously, in contrast to the median magnetic flux, the spread in the magnetic flux may provide the same indication before and after an MFL tool is used. This may mean that while the magnetic flux between conduit lines pre- and post-MFL are not directly comparable, the correlation between line condition is not erased by the conduit's magnetization during inspection by an MFL tool.

The processor 422 also includes an anomaly detector module 430 for detecting anomalies in the fluid conduit. The anomaly detector module 430 identifies potential anomalies by detecting outliers in the magnetic flux data 406 that represent potential anomalies or defects. Anomalies (or defects) may be considered any localized physical condition of the conduit that may threaten performance or safety of the fluid conduit. Examples of potential anomalies in the conduit that may be detected by the outlier detector module 430 include volumetric metal loss, deposits, leaks, pitting corrosion, general corrosion, and the like.

The outlier detector module 430 receives magnetic flux data 406 as an input and generates outlier data 428 as output. The outlier data may include certain magnetic flux data points that identified as outliers in the data and flagged as anomalies. Flagging certain data points as anomalies may allow differential processing of such data in the system 400 (e.g. selectively highlighting outlier data points in a plot of magnetic flux data). In some cases, the outlier data may include an anomaly type.

The outlier detector module 430 may detect outliers in the magnetic flux data using an outlier detection algorithm. The outlier detection algorithm may detect outliers based on a median magnetic flux and the magnetic flux spread data 426 (e.g. IQR).

In another embodiment, the outlier detection algorithm detects external corrosion in the fluid conduit. The outlier detection algorithm detects increases in the spread of the magnetic flux measurements in localized areas by analyzing the magnetic flux spread data 426. The anomaly detector module 230 may label detected increases as a potential site of external corrosion.

The outlier detection algorithm may detect outliers in the magnetic flux data based on the structure of the magnetic flux.

The outlier detection algorithm may be configured to disregard larger, smoother structures in the magnetic flux data 406 indicators for metal loss.

The outlier detection algorithm may be configured to identify magnetic flux measurements which have unusually high or unusually low magnetic flux. Whether magnetic flux data is unusually high or low may be determined using the reference data 418 (e.g. thresholds, historical data).

The outlier detection algorithm may be configured to identify or detect sharp spikes or rapid fluctuations in magnetic flux data. Sharp spikes or rapid fluctuations in the magnetic flux may, for example, be used as an indicator of metal loss in the fluid conduit wall. Whether a spike in the magnetic flux data 406 is sharp or whether a fluctuation in the magnetic flux data 406 is rapid may be determined using the reference data 418.

The processor 422 also includes a feature localizer 432 for detecting and localizing conduit features. The feature localizer 432 receives sensor data collected by the sensor device from the interior of the non-actively magnetized fluid conduit and identifies feature location data 433 of the location of features along the conduit.

The conduit feature localizer module 432 may include a joint identifier module 434 for localizing conduit joints.

The conduit feature localizer module 432 may include a schedule change identifier module 436 for localizing schedule changes in the conduit.

The conduit feature localizer module 432 may include a bend identifier module 438 for localizing bends in the conduit.

The processor 424 also includes a representation generator module 440 for generating a representation 442 of the conduit condition data that indicates a conduit condition. The conduit condition may be an overall conduit condition and/or a localized anomaly. The representation may be in a form displayable in a user interface 444. In such cases, the user interface presents the representation 442 to a user, such as a pipeline operator, for review. As the representation 442 indicates a conduit condition, the user can determine or identify the conduit condition by reviewing the representation. The user can then take any necessary subsequent remedial action.

The representation may be any one or more of a visualization, such as graph (e.g. FIGS. 7 to 10), a continuous variable value (e.g. a magnetic spread value, such as 0.5 Gauss; a health percentage), and a discrete or categorical variable value (e.g. a condition classification, such as "good" or "bad").

In some cases, the representation 442 may be generated using a machine learning model. For example, a machine learning-based classifier may be trained to receive conduit condition data including magnetic spread data 426 at an input layer and assign a class label (e.g. good, bad) at an output layer.

In embodiments where the representation 442 is a visualization 446, the processor may also include a visualization generator module 448 for generating the visualization 446. The visualization 446 presents the results of the fluid conduit inspection process to a user. The visualization 446 may be a user interface configured to graphically display data. The visualization 446 may include one or more graphs or charts for displaying analyzed data.

The visualization 446 displays any one or more of the magnetic flux data, the magnetic flux spread data, the anomaly localization data, and the feature localization data.

In an embodiment, the visualization 446 includes a conduit map. The conduit map may be rendered in a user interface at a display (e.g. display 452). The visualization 446 may include anomaly localization data and/or feature localization data overlaid or otherwise indicated on the conduit map. For example, the visualization 446 may include an exclamation point or other indicator located on the conduit map at the location of the localized anomaly or localized feature. A user can view the visualization and identify areas of concern. In some cases, the indicator may include additional information such as an anomaly or feature type. In another variation, the visualization may include overall conduit condition information (which may be derived, for example, from the magnetic spread data) applied to the conduit map. The overall conduit condition information may be indicated with an icon or other indicator. For example, the visualization may highlight or indicate a segment of the conduit on the conduit map which has a particular associated condition (e.g. bad). The visualization may be interactive and receptive to user input. For example, a user may click on or otherwise select a portion of the map which includes an indicator (of an anomaly, feature) and the visualization may provide further information about the anomaly, feature, or condition, such as via a pop-up window.

The visualization 446 may include a graph of magnetic flux plotted against distance.

The graph may include the magnetic flux data 406 (i.e. the raw magnetic flux measurements) plotted as a line graph.

The graph may include the magnetic flux spread data 426 plotted as a band. The magnetic flux data 406 may be plotted as an overlay on top of the magnetic spread data 426. The magnetic flux data 406 and the spread data 426 may be differentially highlighted such that both sets of data can be seen on the same graph.

The graph may include anomaly localization data. The outlier data 438 may be visualized by highlighting portions of the magnetic flux data 406 (e.g. line plot) which have been identified as outliers by the magnetic flux outlier detector module 430 as outliers. Outlier data may be highlighted using a different colour for a portion of the plotted magnetic flux data corresponding to an outlier or by outlining outlier portions of the data using a bounding box or the like.

The graph may include conduit feature data 450. For example, a particular identified feature may be plotted as a straight vertical line from the x-axis (distance) at a particular distance value on the x-axis. Line height may be uniform among features and extend the height of the y-axis. Line width may depend on how far the feature extends along the fluid conduit. For example, while a joint may extend only a short distance, a bend or thicker wall segment may extend longer distances. Accordingly, the line width may give a sense of along what length of the fluid conduit an identified feature can be found.

In some embodiments, the visualization may display MFL inspection data 416. The MFL inspection data 416 may be displayed as metal loss depth (%) plotted against distance. The MFL inspection data 416 may be displayed along with the sensor data such that comparative analysis can be performed.

The data processing system 400 includes a display 452 for displaying the visualization 446. In other embodiments, the display 452 may be at a data receiving device (e.g. device 22 of FIG. 14, below).

The processor 422 includes a spread determinator module 454 for determining a spread in magnetic flux data, which is stored in memory as magnetic flux spread data 426.

The processor 422 includes a conduit feature identifier module 456, which generates feature data 450 from sensor data 404. The feature data 450 includes a feature type/label and a feature location.

Embodiments of the data processing system 400 may implement machine learning techniques. For example, any one or more of the modules or components implemented at processor 422 may include a machine learning (ML) model. The ML model may be configured to receive sensor data, or data derived therefrom, at an input layer and generate a prediction (e.g. anomaly localization, overall condition, conduit feature) at an output layer. The ML model may include a classifier configured to assign a class label at the output layer. The classifier may be a conduit feature classifier (e.g. joint, bend, schedule change), an overall condition classifier (e.g. good, bad), or an anomaly classifier (e.g. volumetric metal loss).

Figure 5:
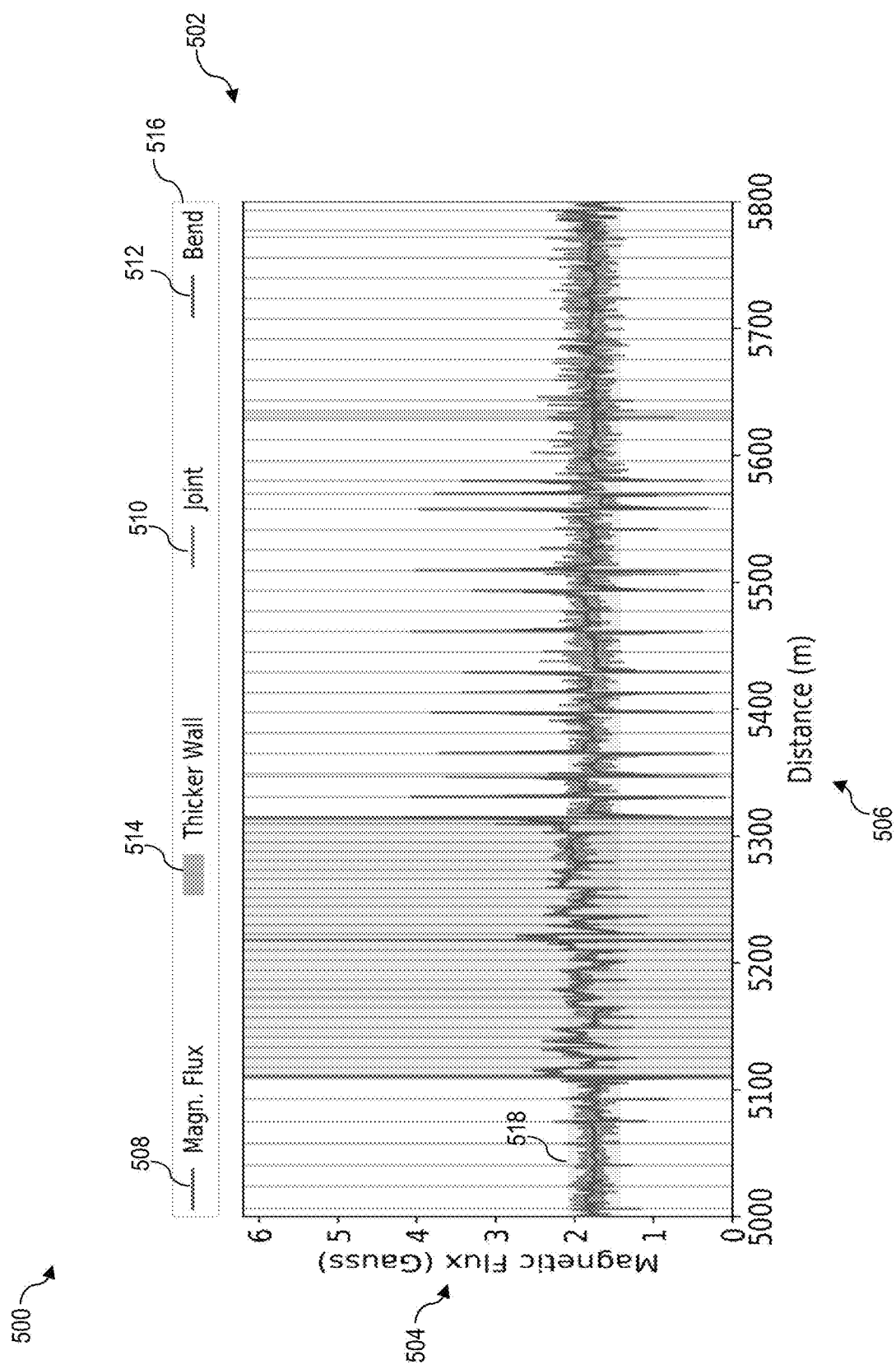
FIG. 5 is an example visualization generated by the data processing system of FIG. 4, according to an embodiment.

Referring now to FIG. 5, shown therein is an example graphical interface 500 of a fluid conduit inspection system used to inspect a 9 km steel pipeline, according to an embodiment. The graphical interface 500 may be displayed by a display device, such as the display device 240 of FIG. 2 or the display 452 of FIG. 4.

The graphical interface 500 includes a visualization 502 for determining a pipeline wall condition for an 8-inch diameter gas pipeline. The visualization 502 may be the visualization 446 of FIG. 4. The visualization 502 may be generated by the visualization generator module 448 of FIG. 4.

The visualization 502 displays conduit feature data (e.g. conduit feature data 4450 of FIG. 4), magnetic flux data (e.g. magnetic flux data 406 of FIG. 4), and magnetic flux spread data (e.g. spread data 426 of FIG. 4).

The visualization 502 includes a plot (or graph) of magnetic flux on the y-axis 504 and distance on the x-axis 506. The distances correspond to a location along the length of the pipeline. As shown, visualization 502 includes only a segment of the pipeline from 5000 m to 5800 m.

The graphical interface 500 shows magnetic flux measured in a gas pipeline. When presented with the graphical interface 500, a user can perform a wall condition assessment for the pipeline wall.

The graphical interface 500 includes a graph 502 plotting magnetic flux on the y-axis 504 against distance on the x-axis 506. The graph 502 plots data points from magnetic flux data 508 collected from inside a gas pipeline as a line graph. Each magnetic flux data point includes a magnetic flux value and a distance value (indicating where along the pipeline the measurement was taken).

The graph 502 also includes conduit feature data, such as the conduit feature data 450 of FIG. 4. The conduit feature data includes joints 510, bends 512, and thicker wall areas 514. Conduit features 510, 512, 514 are indicated on the graph 502 by vertical lines extending the length of the y-axis 504.

The graph 502 identifies a plurality of joints 510 located along the length of the pipeline.

The graphical interface 500 includes a legend 516 for indicating how various data such as magnetic flux data 508, joints 510, bends 512, and thicker wall areas 514 are displayed on the graph 502.

The graph 502 also includes magnetic flux spread data 518. The magnetic flux spread data may be the spread data 426 of FIG. 4. The magnetic spread data 518 is plotted and presented on the graph 502 as a band. The band extends from approximately 1.5 Gauss to 2.1 Gauss on the y-axis 504 and from 5000 m to 5800 m on the x-axis (e.g. a spread of approximately 0.6 Gauss). The magnetic spread data 518 may be highlighted to be more readily visible, for example using a unique colour (e.g. green).

The magnetic spread data 518 provides an indicator of wall condition for the pipeline. Accordingly, a user can review the spread data 518 as presented on graph 502 and determine a pipeline wall condition for the pipeline.

The presence of the conduit feature data may allow a user to consider the location of such features when reviewing the magnetic flux spread data 508 to determine a pipeline wall condition.

As an example of what these signals look like in the magnetic flux, a section of magnetic data from the 9 km steel line is shown in FIG. 5. This section of the pipeline includes joints 510, bends 512 and a schedule change 514 which the fluid conduit system identified and which were corroborated by both an ILI report and pipeline diagram. The sharp spikes at the joints 510 are indicated by vertical grey lines and there is a change in the magnetic flux 508 visible at the schedule change 514 from 5,110 m to 5,315 m surrounded by large spikes indicating the start and end of the schedule change. The bends 512 were identified using a gyroscope of the sensor device. In other embodiments, the system may detect increases in magnetic flux 508 as an indicator of bends 512 and use the location information (e.g. distance 506) to identify the location of the bends 512.

When comparing the data from the fluid conduit inspection system with the ILI report, the system reported all the same bends and correctly identified locations with increased wall thickness (excluding wall thickness increases at bends, which all had thicker wall reported in the ILI report). Further, the joint pattern in the sensor device data indicates the pipeline was built with 18 m spool pieces, which was confirmed by the ILI report.

Figure 6:
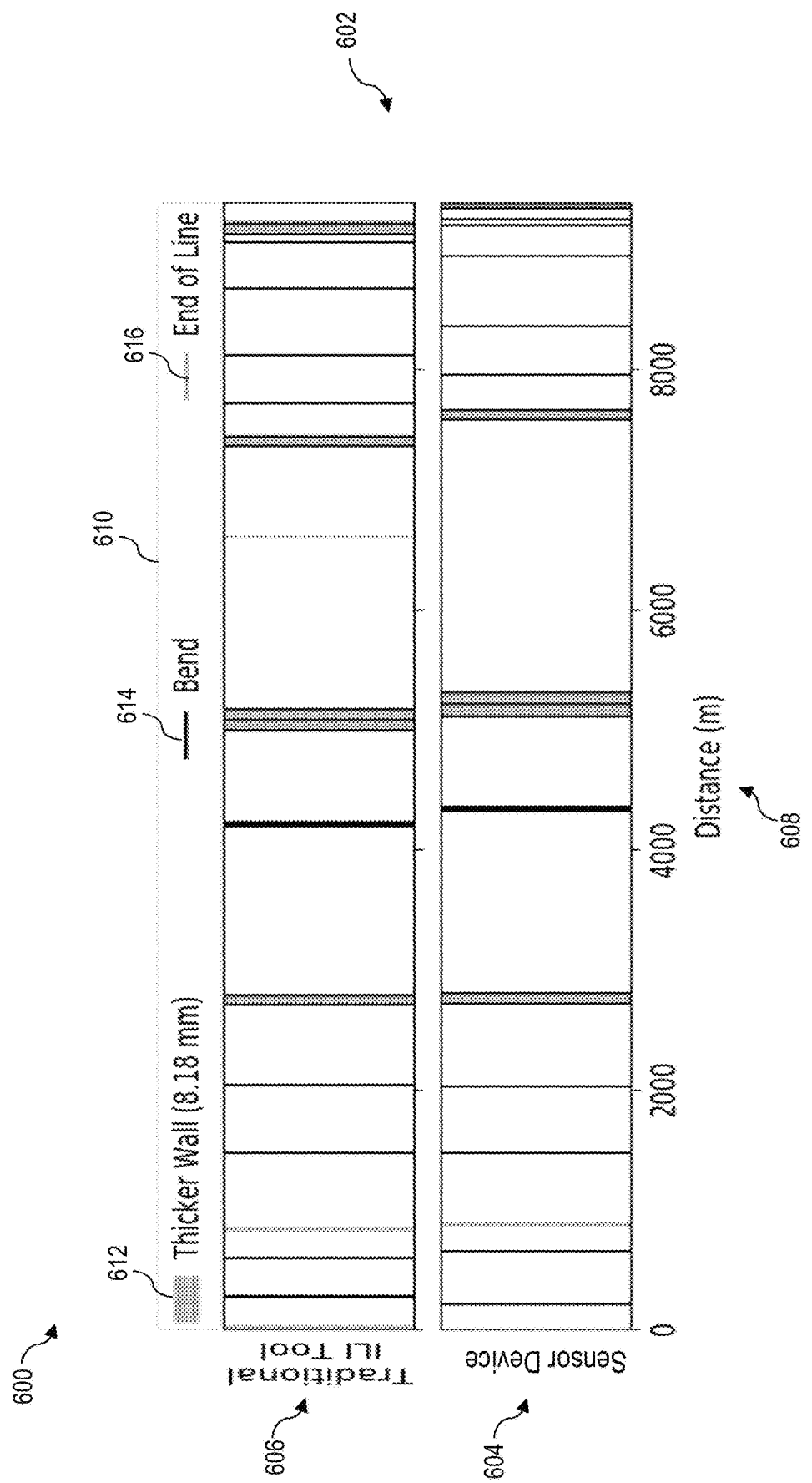
FIG. 6 is an example visualization generated by the data processing system of FIG. 4 comparing pipeline feature localization as reported by a traditional MFL tool and a sensor device of the present disclosure, according to an embodiment.

Referring now to FIG. 6, shown therein is a graphical interface 600 of a fluid conduit inspection system, according to an embodiment. The graphical interface 600 may be displayed by a display device, such as the display device 240 of FIG. 2 or the display 452 of FIG. 4.

The graphical interface 600 includes a visualization 602 for comparing a conduit feature localization output of the fluid conduit inspection system of the present disclosure with a feature localization output of a traditional inline inspection (ILI) tool for the pipeline of FIG. 5.

The visualization 602 plots feature localization data from the sensor device 604 and ILI data from a traditional ILI tool 606 against distance 608, where distance 608 represents a position along the length of the pipeline.

The visualization includes a legend 610 indicating how different types of feature localization data is displayed, such as thicker wall segments 612, bends 614, and an end of line 616.

The visualization 602 can be used to compare conduit feature localization performed by the fluid conduit inspection system and identify discrepancies with pipeline feature localization as reported by the ILI tool.

The visualization 602 shows a comparison of locations of bends 614 and schedule changes 612 and the reported distances for each of the sensor device 604 and the ILI tool 606. A user viewing the visualization 602 can identify discrepancies.

As can be seen, the absolute distances of the localized bends 614 and schedule changes 612 for the sensor device show a discrepancy when compared to the bends 614 and schedule changes 612 identified by the ILI tool. The differences may be accounted for by the difference in measurement techniques between the sensor device 604 and the ILI tool 606. A traditional smart pig (i.e. ILI tool) is equipped with one or more odometer wheels which record the distance traveled by the smart pig. In contrast, the sensor device 604 does not make wall contact with the pipeline wall and computes the distance using an algorithm which may incorporate any one or more of typical spool lengths, average speed, pipeline features such as bends, risers and river or road crossings at known locations (also called "hard markers"), the provided pipeline length, and, line diagrams of the pipeline.

The pipeline measured in FIG. 6 included multiple known bends at known locations as well as an above ground riser at a license change. The distances of these locations in the pipeline were measured using Google Earth. The visualization 602 illustrates an obvious shift in distance measurements between the sensor device 604 and the ILI tool 606 from 4000 m onwards. The discrepancy may be attributable to slippage in the odometer wheels of the ILI tool. After the bends 614 around 4.1-4.2 km, the sensor device 604 and the ILI tool 606 show similar distances between major features. Accordingly, it appears the cause of the only distance discrepancy occurred somewhere between 2.8 km and 4.1 km.

By comparing the localized feature data from the sensor device and ILI tools in the visualization 602, it can be seen that the sensor device provides an accurate device for measuring pipeline features such as joints, bends, and schedule changes via the collection and magnetic flux data from an interior of the pipeline without actively magnetizing the pipeline.

Referring now to FIGS. 7 to 10, shown therein are example graphical interfaces generated by an embodiment of the fluid conduit inspection system of the present disclosure. Fluid conduit inspection as described herein was performed on a plurality of 3-inch pipelines carrying an oil emulsion. The graphical interfaces (via the data displayed therein) can be used to determine an overall condition for the pipeline. For comparison purposes, the graphical interfaces also include MFL screening data indicating metal loss features identified from screening using an MFL tool. In particular, a comparison of fluid conduit inspection data with the MFL screening data illustrates the ability of the present fluid conduit inspection system and sensor device to identify and localize areas of a pipeline with significant (e.g. >25%) volumetric wall loss using fluid conduit inspection visualizations generated by the system of the present disclosure.

Figure 7:
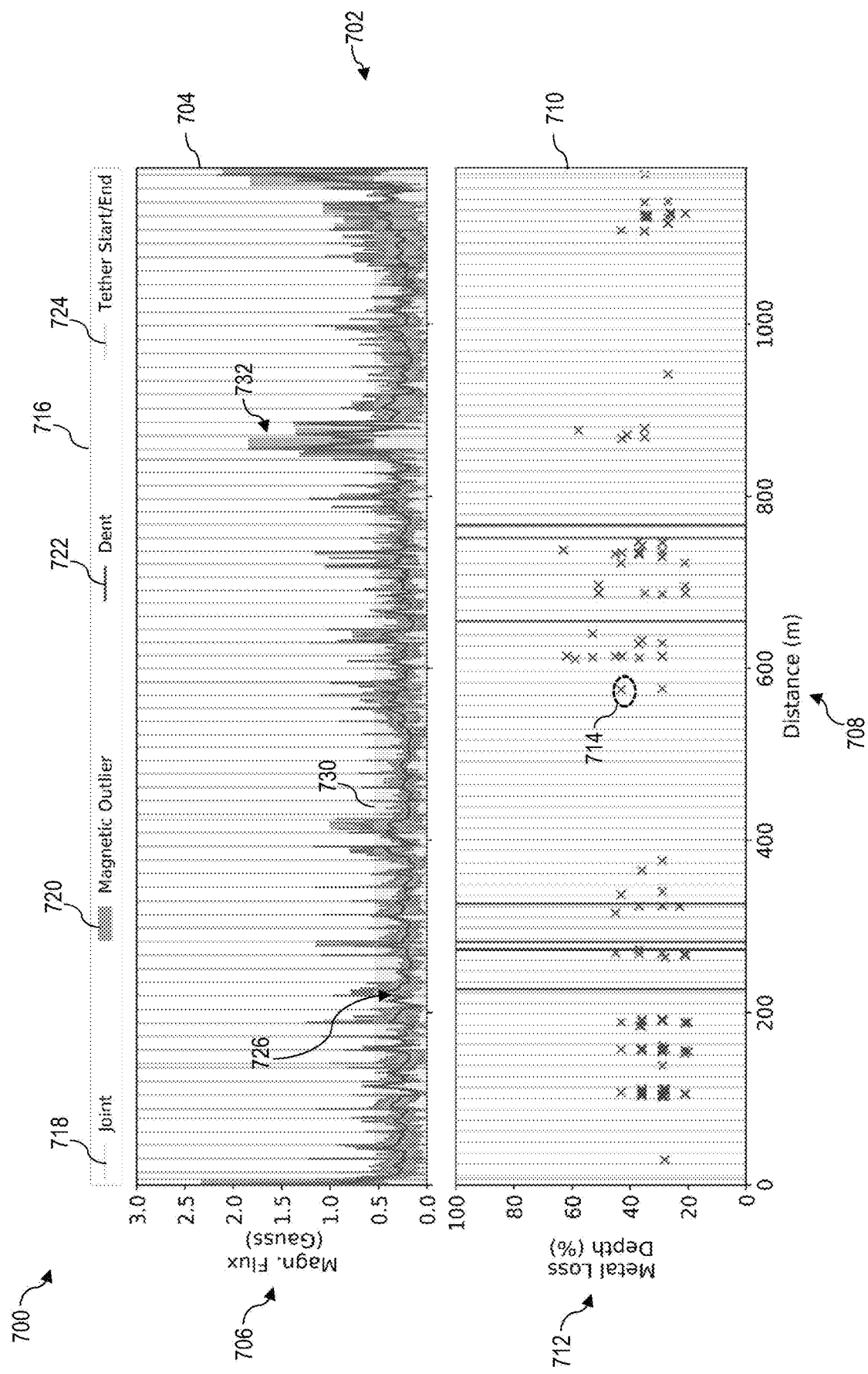
FIG. 7 is an example visualization generated by the data processing system of FIG. 4 for a first pipeline segment, according to an embodiment.

Referring now to FIG. 7, shown therein is an example graphical interface 700 of a fluid conduit inspection system, such as system 200 of FIG. 2, according to an embodiment. The graphical interface 700 may be the visualization 446 of FIG. 4. The graphical interface 700 may be displayed by a display device, such as the display device 240 of FIG. 2 or the display 452 of FIG. 4.

The graphical interface 700 includes a visualization 702 for determining a pipeline wall condition for a first 3-inch oil emulsion pipeline. The visualization 702 may be the visualization 446 of FIG. 4. The visualization 702 may be generated by the visualization generator module 448 of FIG. 4.

The visualization 702 displays feature localization data (e.g. feature localization data 433 of FIG. 4), magnetic flux data (e.g. magnetic flux data 406 of FIG. 4), and magnetic flux spread data (e.g. spread data 426 of FIG. 4).

The visualization 702 includes a passive magnetometry plot 704 (or graph) of magnetic flux on the y-axis 706 and distance on the x-axis 708. The distances correspond to a location along the length of the pipeline. As shown, visualization 502 includes a segment of the pipeline from 0m to over 1000 m.

The graphical interface 700 shows magnetic flux measured in the oil emulsion pipeline. When presented with the graphical interface 700, a user can perform a wall condition assessment for the pipeline wall.

The graphical interface 700 also includes an MFL screening data plot 710 of metal loss depth data on the y-axis 712 and distance on the x-axis 708. Metal loss depth data points are plotted on the plot 710 as x's. An example metal loss depth data point is shown at 714. The MFL screening data plot 710 can be used to compare and/or verify data presented in the plot 704. In some embodiments, the visualization 702 does not include the MFL screening data plot 710.

The graphical interface 700 includes a legend 716 for indicating how various data such as joints 718, magnetic outliers 720, dents 722 and a tether start/end 724 are displayed on the plot 702. Tether is a way of running the MFL tool. The MFL tool is attached with a 'rope' or 'line' instead of just by itself. This is form of inspection is called a tethered MFL inspection.

The plot 704 includes magnetic flux data 726 collected from inside the pipeline. The magnetic flux data 726 includes a plurality of data points plotted as a line graph.

The plot 704 also includes feature localization data (e.g. feature localization data 433 of FIG. 4). Feature localization data includes joints 718. The feature localization data 728 is plotted using a distance value (e.g. with no flux value, as a straight vertical line). The feature localization data 728 may be plotted in such a way as to provide a user of the graphical interface 700 additional information to consider when making a pipeline condition determination.

The plot 704 also includes magnetic spread data 730 for determining a pipeline condition for the pipeline. The magnetic spread data 730 may be generated by the spread determinator module 424 of FIG. 4. The magnetic flux spread data 730 in FIG. 7 includes a magnetic flux spread value which is plotted on the plot 704 as a horizontal line (or band). The magnetic flux spread value for the pipeline is approximately 0.6 Gauss. A user can view the visualization 702 including the magnetic spread data 730 to determine a pipeline condition for the pipeline. A lower spread value (e.g. IQR) for the magnetic flux may indicate a better condition, while a higher spread value indicates a worse condition. The 0.6 Gauss spread value indicates an overall good condition for the first pipeline when analyzed in view of reference data 418 such as pipeline diameter, pipeline material, and other pipelines in the area (e.g. other 3-inch lines). Further, the magnetic spread data 730 shows a smooth magnetic flux with low variation which can be used as an indicator of pipeline condition. Typically, smooth and low variation indicate a good condition for the pipeline (which may also take into account reference data 418). An overall condition determination may also depend on the history of the pipeline which may be used with the spread in determining an overall pipeline condition.

The plot 704 also includes anomaly localization data 732 for identifying a localized pipeline wall condition (i.e. a potential anomaly or defect). The anomaly localization data 732 includes detected magnetic outliers. In the case of graphical interface 700, the anomaly localization data 732 identifies locations of metal loss. The magnetic outlier data 732 may be a subset of the magnetic flux data 726 that has met some outlier criterion based on analysis, for example, via an outlier detection algorithm 430. In some cases, magnetic flux data 726 that meets the outlier criterion may be labelled, flagged, tagged, or the like in the system such that it can be distinguished from other magnetic flux measurements in the magnetic flux data 726. By doing so, the system can differentially process the anomaly localization data 732. An example of such differential processing is shown in FIG. 7, where anomaly localization data 732 is highlighted (e.g. using a unique colour, label, bounding box, etc.) on the plotted magnetic flux data 726.

A user of the system can view graphical interface 700 and identify sites of potential metal loss using the highlighted anomaly localization data 732 (which includes distance or location information). An example of a determined magnetic outlier is shown at 732.

A separate assessment of the first pipeline indicated the pipeline appeared to be in overall good condition with a few areas of pitting corrosion reported by an MFL inspection (MFL plot 710). The metal loss features shown in the MFL plot 710 have some higher percentage metal loss in terms of depth (in the 50%-60% range), but most (over 90%) of the metal loss is 45% or less by depth. Most of these metal loss features are also small pits (less than 1 cm2 in size) which are not dense enough to form significant clusters. While this line does have some significant pitting corrosion, the corrosion is more localized and most of the line shows no metal loss in the MFL report. Taken together, it appears that the line is overall good condition, and this matches the lower IQR measured in the magnetic flux of the sensor device screening.

Figure 8:
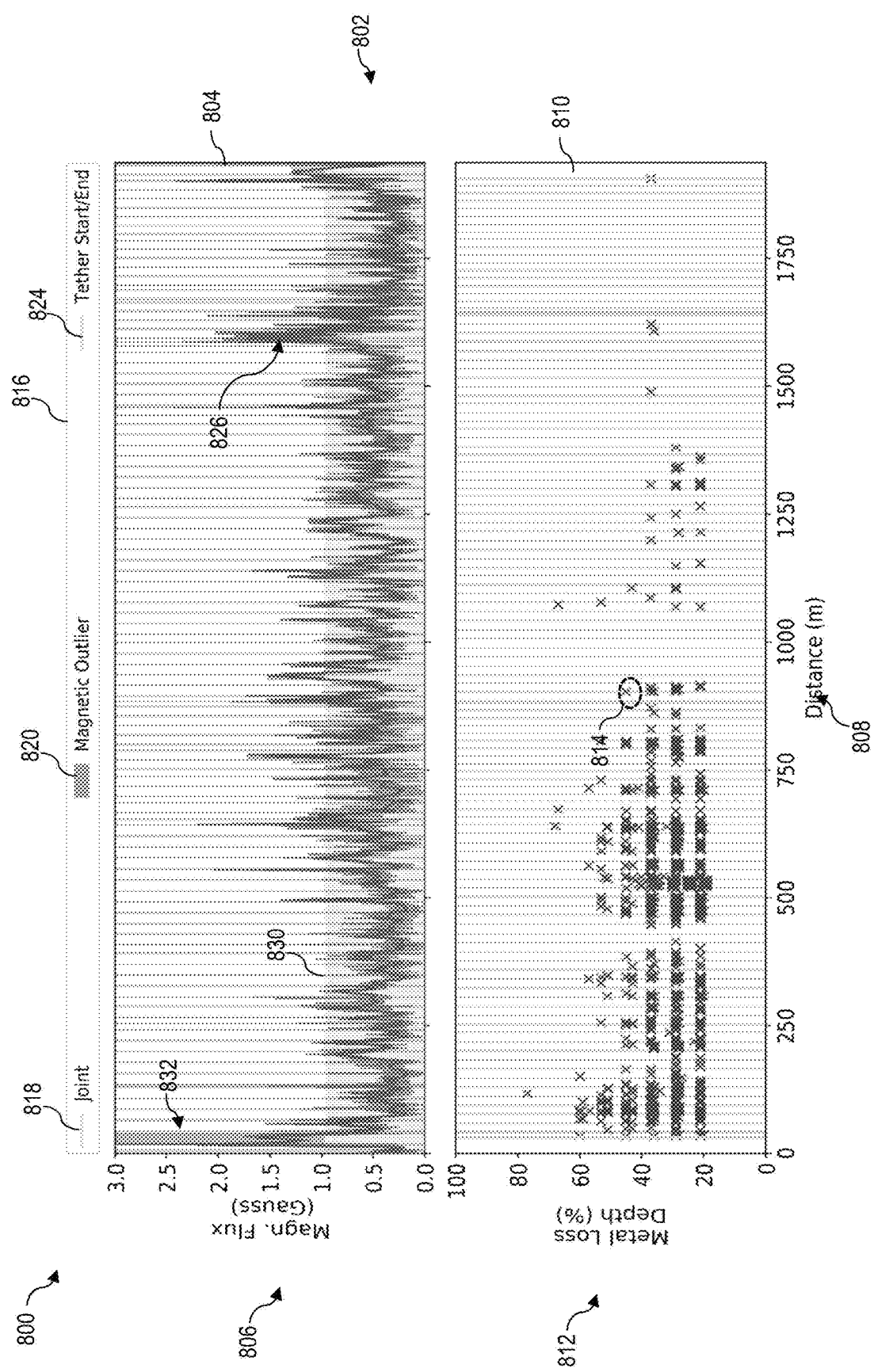
FIG. 8 is an example visualization generated by the data processing system of FIG. 4 for a second pipeline segment, according to an embodiment.
Figure 9:
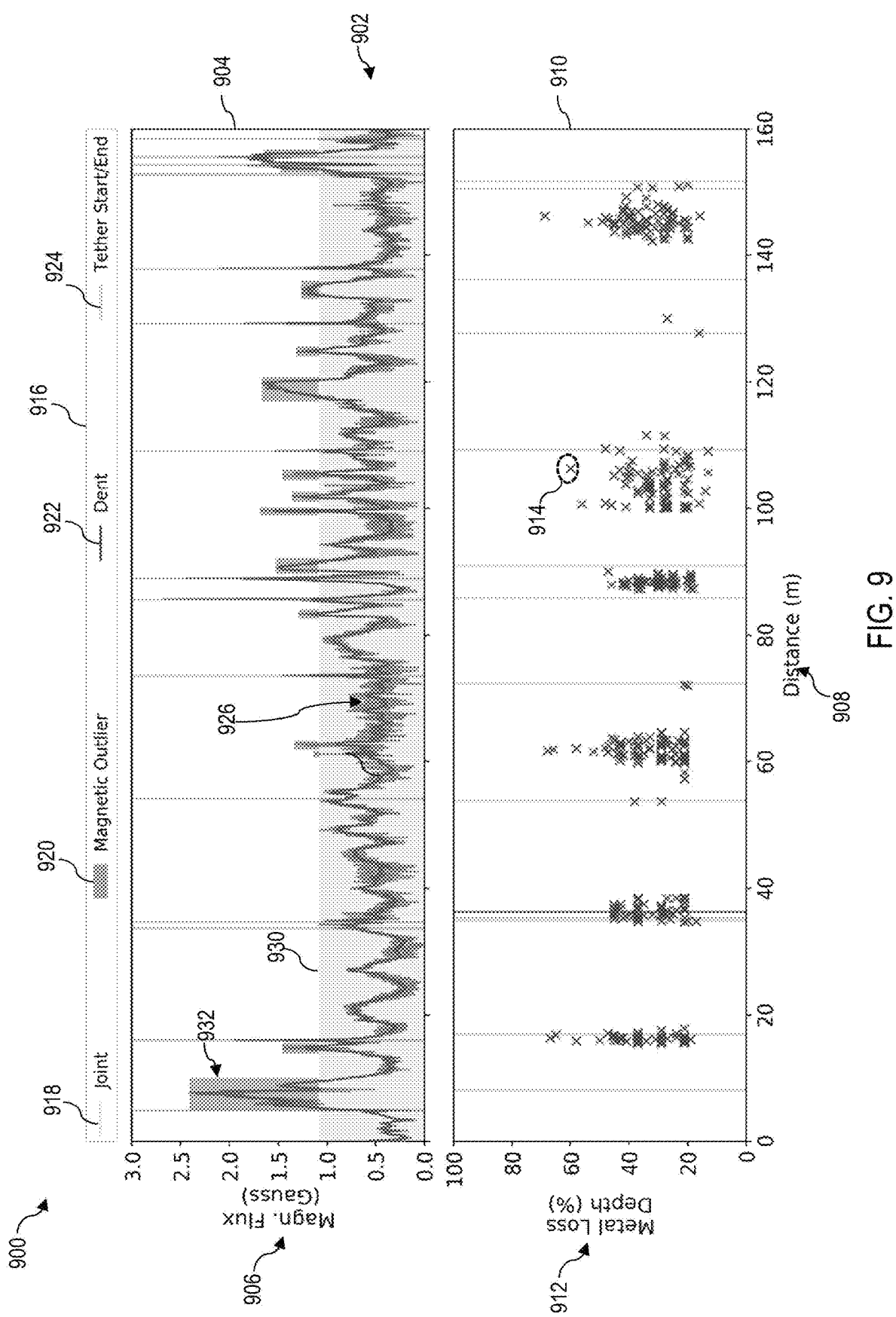
FIG. 9 is an example visualization generated by the data processing system of FIG. 4 for a third pipeline segment, according to an embodiment.
Figure 10:
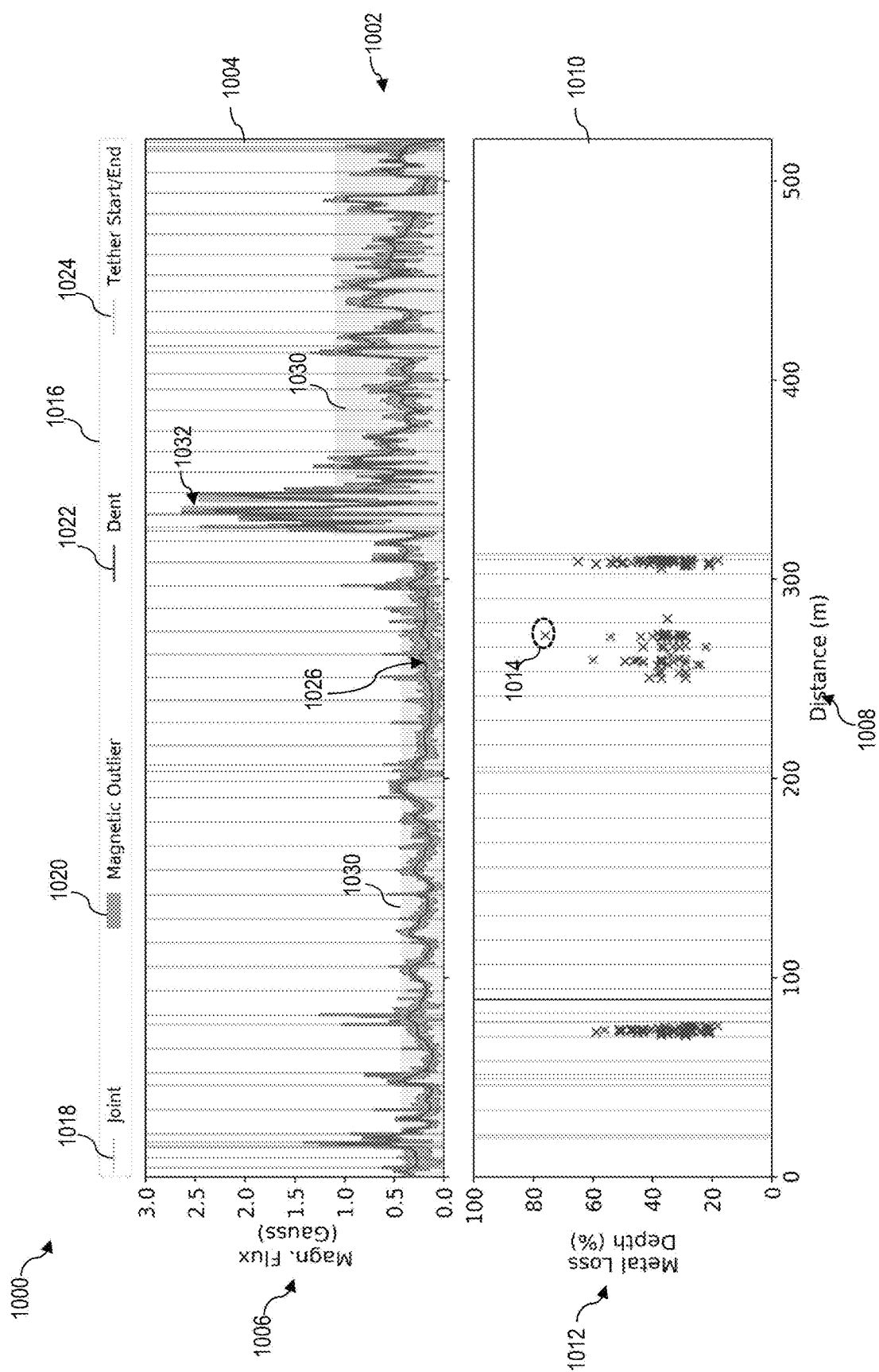
FIG. 10 is an example visualization generated by the data processing system of FIG. 4 for a fourth pipeline segment, according to an embodiment.

Each of FIGS. 8, 9, 10, reference the same parameters as FIG. 7, with the reference numbers among FIGS. 7-10 correspond except for the first digit (i.e. 7xx, 8xx, 9xx, 10xx).

Referring now to FIG. 8, shown therein is an example graphical interface 800 of a fluid conduit inspection system, such as system 200 of FIG. 2, according to an embodiment. The graphical interface 800 may be the visualization 446 of FIG. 4. The graphical interface 800 may be displayed by a display device, such as the display device 240 of FIG. 2 or the display 452 of FIG. 4.

The graphical interface 800 includes a visualization 802 for determining a pipeline wall condition for a second 3-inch oil emulsion pipeline. The visualization 802 may be the visualization 446 of FIG. 4. The visualization 802 may be generated by the visualization generator module 448 of FIG. 4.

The magnetic flux spread data shows a less smooth, higher variation magnetic flux which indicates a worse overall pipeline condition in view of reference data (e.g. reference data 418). Reference data may include data for other 3-inch lines, smoothness, variation, etc.

Line 2 has lots of metal loss features reported with relatively high density in the first portion of the line. The magnetic flux and the metal loss defects from this line are shown in FIG. 8. Like the metal loss in line 1, while there were some higher percentage depths reported, over 90% of the metal loss features were 45% or lower by depth (shown in MFL data 810). While most of the metal loss is small pitting type corrosion, the number and density of them is high, especially in in the first 800 m of this line (typically between 2 to 20 metal loss features per meter in the first 800 m).

Using the plot 804, it appears that this line is in worse overall condition, especially compared to line 1. This conclusion is consistent with the assessment from the fluid conduit inspection system of the present disclosure where its higher IQR indicates this line is in worse condition compared to line 1.

It was noted that this first 800 m of the line was travelling up a hill. The oil emulsion coming out of the well at this location has a gas component, potentially leading to liquid holdup or slugging in the line. While not investigated in detail, the speed profile of the sensor device during the screening was variable and slower in the first 800 m and helps to explain why the line appears to be in worse condition in the first part of this line. Since the sensor device travel with the normal operational fluid, this potentially allows for the identification of high-risk areas for corrosion.

Line 2 shows more metal loss in the first part of the line compared to the rest of the line. The spread in the magnetic flux, however, does not change significantly over the length of the line. (see plot 804). What does change, instead, is the structure of the magnetic flux 826.

Referring now to FIG. 9, shown therein is an example graphical interface 900 of a fluid conduit inspection system, such as system 200 of FIG. 2, according to an embodiment. The graphical interface 900 includes a visualization 902 for determining a pipeline wall condition for a third 3-inch oil emulsion pipeline.

The magnetic flux data shows a larger spread in the magnetic flux which indicates a worse pipeline condition.

Line 3 is the shortest line screened from this field and, as indicated by the MFL data 810, has significant corrosion listed in almost every single spool piece inspected. The corrosion in line 3 was much larger in size (in terms of width and length) and the areas with corrosion occur in groups. Based on this, it appears this line is in overall worse condition compared to the other lines. This conclusion corresponds with the output of the fluid conduit system, where a much higher IQR (e.g. spread data 930) was determined compared to other lines with MFL inspection data.

In line 3, the magnetic flux has sharp spikes at 12 m, 60 m and from 100 m to 109 m (identified as outliers and labelled in orange) and additionally at 148 m (which is not an orange outlier). These locations correlate with metal loss features with 20%-30% volumetric metal loss. In contrast, the group of metal loss features at 88 m are all below 10% volumetric wall loss and there is no obvious spikes or anomalies in the magnetic flux here.

The outlier detection used may accurately identify areas which have magnetic flux signals which can be identified as corrosion or metal loss and include the structure of the features as well. In line 3 of the 3-inch lines, for example, the larger percentage volumetric metal loss near the end of the line was not an outlier in the magnetic flux, but it does have spiky structure or signal which can be identified. In some cases, the data processing system of the present disclosure may be configured to extract and label magnetic flux having a certain structure or signal, associate such indicators with a potential integrity concern, and determine defect sizing or burst pressure calculations.

Referring now to FIG. 10, shown therein is an example graphical interface 1000 of a fluid conduit inspection system, such as system 200 of FIG. 2, according to an embodiment. The graphical interface 1000 includes a visualization 1002 for determining a pipeline wall condition for a fourth 3-inch oil emulsion pipeline.

Line 4 was only inspected by the MFL tool from the start up to about 300 m due to constraints with the tether on the MFL tool which prevented it from inspecting the entire line. The magnetic flux and the metal loss defects from this section of the line are shown in FIG. 10. The last part of the line could not be compared with the ILI report; however, in the first part of line 4 there are only three main areas (20 m-60 m long) with metal loss listed. Most of line 4 does not have any reported metal loss suggesting that the line is in overall good condition. This conclusion corresponds with the output of the fluid conduit system, where a relatively low IQR of the magnetic flux was determined by the data processing system.

The second part of line 4 was un-inspected by the ILI technique and shows the largest IQR among all the lines screened in this field (lines 1-4). Based on this, is the second part of line 4 is expected to be in worse condition compared to the other lines. Notably, even in the pre-MFL screening data both parts of line 4 showed significant differences magnetic flux. Based on this, it was initially reported that the last part of line 4 where the magnetic flux suddenly increases was expected to be either in much worse condition, constructed of significantly different steel (e.g. different grade, or wall thickness), or much older than the rest of line 4. Additional data confirmed that this part of line 4 is older and the first 300 m of line 4 is a newer section of pipe which was constructed at a later date, which corresponds with the fluid conduit system determination of a sudden change in magnetic flux (and condition) after 320 m.

Line 4 shows less strong correlations with the metal loss despite also having larger volumetric wall loss. The metal loss in line 4 is all external, which may be more difficult to detect for this type of inline detection technique. In an embodiment, the fluid conduit inspection system may be configured to detect increases in spread, such as he increase in the spread 1030 in the magnetic flux 1026 around the locations of the metal loss in line 4, and use such detection output as an indicator of conduit condition. In an embodiment, the fluid conduit inspection system of the present disclosure may identify external corrosion in a conduit by identifying localized areas with a larger spread (such as spread 1030 shown in second part of line 4) or other changes in the magnetic flux 1026.

Figure 11:
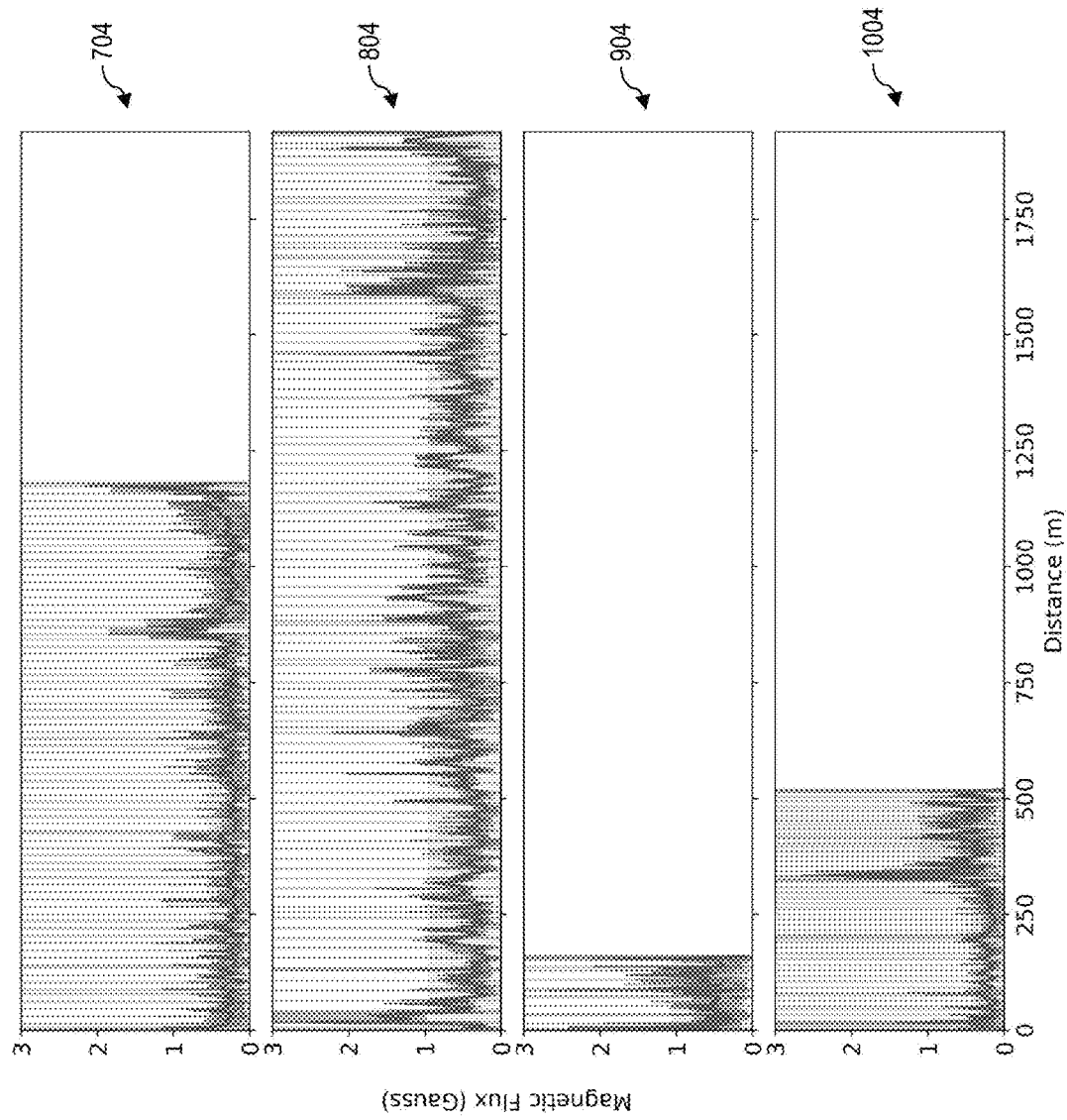
FIG. 11 is an example visualization generated by the data processing system of FIG. 4 illustrating multiple pipeline segments, according to an embodiment.

Referring now to FIG. 11, shown therein is a graphical interface 1100 of a fluid conduit inspection system, according to an embodiment. The graphical interface 1100 includes plots 704, 804, 904, and 1004 of FIGS. 7 to 10. As shown, in some variations, the system 400 may be configured to output a graphical interface displaying visualizations of a plurality of pipelines in a single graphical interface 1100, which may allow a user to review data of multiple pipelines at once and in comparison with one another.

Figure 13:
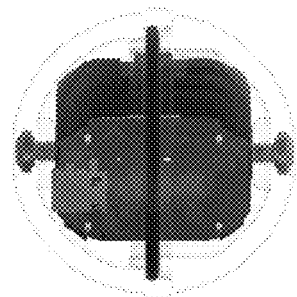
FIGS. 12 and 13 are a schematic diagram illustrating two embodiments of the sensor device of the present disclosure.
Figure 12:
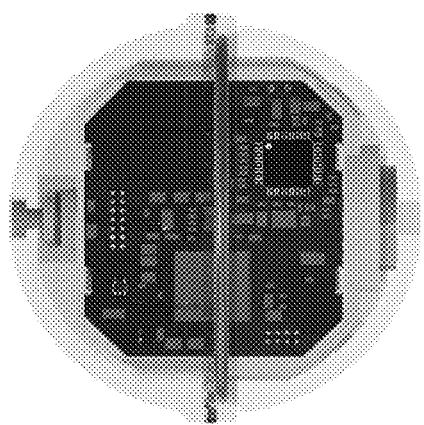

Referring now to FIGS. 12 and 13, shown therein two example embodiments 1310, 1320 of the sensor device of the present disclosure. Sensor devices 1310, 1320 may be the sensor device 222 of FIG. 2 or the sensor device 302 of FIG. 3. The sensor device may be for example the sensor device of United States Patent application Publication number US20180171783A1, Ser. No. 15/843,310, which is hereby incorporated by reference in its entirety.

The sensor devices 1310, 1320 are first and second example embodiments of a sensor device for collecting passive magnetic flux data from inside a fluid conduit, such as a pipeline.

The sensor devices 1310, 1320 include a spherical shaped outer capsule enclosing various operable components of the sensor device, such described with reference to sensor device 302 of FIG. 3. The outer capsule in devices 1310, 1320 is shown as transparent for the purposes of the present disclosure and may be transparent, opaque, etc. The outer capsule includes a first portion and a second portion which connect to fluidly seal the sensor device. The sensor devices 1310, 1320 are free-floating, neutrally buoyant, and chemically inert. The sensor devices 1310, 1320 may float along with the fluid in the fluid conduit. The sensor devices 1310, 1320 are attachable to a pig or the like.

Sensor device 1310 has a 2.2-inch diameter. Sensor device 1310 may be pressure rated up to 1450 PSI. Sensor device 1310 may record greater than 24 hours of data. Sensor device may be Zone 0 rated.

Sensor device 1320 has a 1.5-inch diameter. Sensor device 1320 may be pressure rated up to 435 PSI. Sensor device 1320 may record up to 2 hours of data. Sensor device 1320 may be zone 0 rated.

The system described herein may be run in unpiggable fluid conduits, multi-diameter conduits, conduits with internal liners, pass sharp bends and conduits with no pigging facilities. The system may provide ease of deployment and may be deployable by regular field staff. The system can run during regular operations. The system can run during regular cleanings (e.g. attached to a cleaning pig). The system may help manage risk. The system may optimize efforts on larger fields. The system may provide overall condition assessment. The system may identify significant metal loss and other anomalies. The system may be low cost and provide easy accessibility to assets with no or little information. The system may provide repeated screenings to lead to increased precision.

The system may get pipeline inspection data without shutting down operations and without human intervention—saving a user both time and money. The system may be small, inaccessible, and capable of inspecting pipelines down to 2" in diameter, even where buried or in remote locations. The system may provide simplicity and ease of use by monitoring pipelines more frequently and efficiently, getting deeper insights that allow for better, more informed decisions. The sensor devices are free-floating and may be certified safe for certain conduit environments. The sensor devices may float along with the fluid in the pipeline and avoid getting stuck, even in complex systems.

The magnetic flux measured by the sensor device can distinguish differences in the relative or overall condition of a pipeline. To demonstrate this, the magnetic flux from the four 3-inch oil emulsion lines in the same area were measured before and after inspection by an MFL tool. The results from the screenings were then compared to the data in the ILI report. There were two main observations made when comparing the pre-MFL, post-MFL and ILI data: between the pre- and post-MFL inspections the magnetic flux changed, and, despite this change, the spread in the magnetic flux correlates with the pipeline's condition in both the pre- and post-MFL magnetic flux data.

It has already been observed when screening other pipelines with the sensor devices that MFL inspections change the magnetic flux in a line. The reason for the change is that an MFL tool runs very strong magnets across the surface of the pipe wall during inspection. This is exactly the same phenomenon which can be observed when rubbing a magnet on a paper clip which turns it into a permanent magnet. As such, the magnetic flux increases after an MFL inspection is both expected and re-confirmed in multiple lines.

From a quantitative perspective, the amount the magnetic flux increases is complex and the change is not a constant offset or percentage increase. A summary of the median magnetic flux in the four pipelines is shown in Table 1:

| | | Pre-MFL | | Post-MFL | | ILI Data | |
|---|---|---|---|---|---|---|---|
| | | Median (Gauss) | IQR (Gauss) | Median (Gauss) | IQR (Gauss) | Corrosion Type | Coverage |
| Field A | Line 1 | 0.16 | 0.04 | 0.26 | 0.19 | Pitting | Localized |
| | Line 2 | 0.18 | 0.10 | 0.45 | 0.34 | Pitting | Large Areas |
| Field B | Line 3 | 0.35 | 0.24 | 0.57 | 0.36 | General + Pitting | Localized |
| | Line 4.1 | 0.20 | 0.05 | 0.23 | 0.15 | General | Localized |
| | Line 4.2 | 0.53 | 0.48 | — | — | — | — |

As shown in Table 1, the median magnetic flux before and after the MFL inspection shows changes with no obvious trend. This is a complex function of the physical properties of the steel and the MFL magnetizers. This, however, is not expected to be a problem because it appears that it is not the overall magnetic flux strength, but the spread or variation in the magnetic flux which is the indicator for pipeline condition.

When considering the overall condition, while all four lines had corrosion identified by the MFL tool, the overall severity, density and number of metal loss features varied across the four lines as discussed in more detail later. When comparing the overall condition according to the fluid conduit inspection system, line 1 and the first part of line 4 have the lowest spread and appear to be in the best overall condition compared to lines 2 and 3 and the second part of line 4. This assessment is based on the spread in the magnetic flux as quantified by the interquartile range (IQR) which is listed in Table 1. In contrast to the median magnetic flux, the relative spread in the magnetic flux provides the same indication before and after the MFL tool was used. This means that while the magnetic flux between lines pre- and post-MFL are not directly comparable, the correlation between line condition is not erased by the pipeline's magnetization during inspection by an MFL tool.

When comparing the overall condition assessment (i.e. spread) from the fluid conduit inspection system of the present disclosure with the MFL results, the general characteristics of the corrosion reported in each line is discussed below, as well as summarized in Table 1. In brief, the metal loss listed in line 1 and 4.1 appears to be the least severe while the metal loss in line 2 and 3 was more severe. A more detailed discussion of each line and a justification for the correlation with the magnetic flux IQR and the ILI reported condition is provided in FIGS. 7 to 10. In the figures the data from the fluid conduit inspection system of the present disclosure screening is shown in the top graph and the depth of the metal loss features reported by the MFL inspection are plotted in the bottom graph and the sizing, clustering or other details are discussed in the text below.

In an embodiment, the systems, methods, and devices for fluid conduit inspection described herein may be used to detect illegal hot taps of a fluid conduit (e.g. fluid conduit 202 of FIG. 2). The system may detect illegal hot taps acoustically and/or magnetically.

The theft of oil from pipelines by installation of illegal hot taps is a major issue which not only costs oil and gas businesses upwards of millions of dollars but can also lead to dangerous loss of containment. By volume, thefts in Nigeria alone are as high as 100,000 to 400,000 barrels of oil each day, and in Mexico the loss of revenue alone is estimated to be over $1 billion dollars yearly.

A growing number of technologies have been developed to identify and prevent these illegal hot taps, some of which are being circumvented by growing sophistication in the methods, tools and techniques used in these oil thefts. Volumetric based techniques, for example, are defeated by reinjection of water into the pipeline during illegal bunkering activities to replace the stolen oil. Other techniques exist which detect pressure waves generated when a hot tap is created; however, these cannot identify any pre-existing hot taps in a line. High-resolution inline inspection tools, like MFL, are expected to accurately locate these hot taps, but can be prohibitively expensive, require heavy equipment and are not suitable for ongoing monitoring for new hot taps as they are created.

The present disclosure provides systems, methods, and devices for detecting illegal hot taps which may overcome one or more disadvantages of existing approaches to detecting hot taps. In an embodiment, a system for detecting hot taps of a fluid conduit utilizes a free-floating multi-sensor device, which may be the sensor device 222 of FIG. 2, sensor device 302 of FIG. 3, or devices 1310, 1320 of FIGS. 12 and 13, for example. The sensor device may be a small (e.g. 2.2-inch diameter) device that floats freely with the fluid, allowing the sensor device to be utilized in virtually any pipeline (regardless of any piggability concerns). The sensor device may also be deployed during regular operations allowing for deployment without loss or interruption of production and without the need for heavy equipment.

In an embodiment, the sensor device may include an acoustic sensor and a magnetometer. The magnetometer measures the magnetic flux which (passively) exists in the fluid conduit (e.g. exists in all steel pipelines). The magnetic flux measurements are stored in a memory of the sensor device as magnetic flux data (e.g. magnetic flux data 406 of FIG. 4).

The magnetic flux data is transferred from the sensor device to a data processing system, such as data processing system 236 of FIG. 2 or data processing system 400 of FIG. 4 via mechanisms described herein. The data processing system is configured to identify locations of potentially illegal bunkering points in the fluid conduit. The data processing system may do so by analyzing the magnetic flux data and detecting unique signatures in the magnetic flux and using an associated location to identify the potential bunkering point.

The system may also be configured to detect active hot taps (i.e. theft in process) using acoustic data and/or magnetic data collected by the sensor device and analyzed by the data processing system. The sound created during active illegal hot tapping can be recorded using the onboard acoustic sensor and recognized and analyzed using the data processing system to detect and localize potential hot tap sites.

Figure 14:
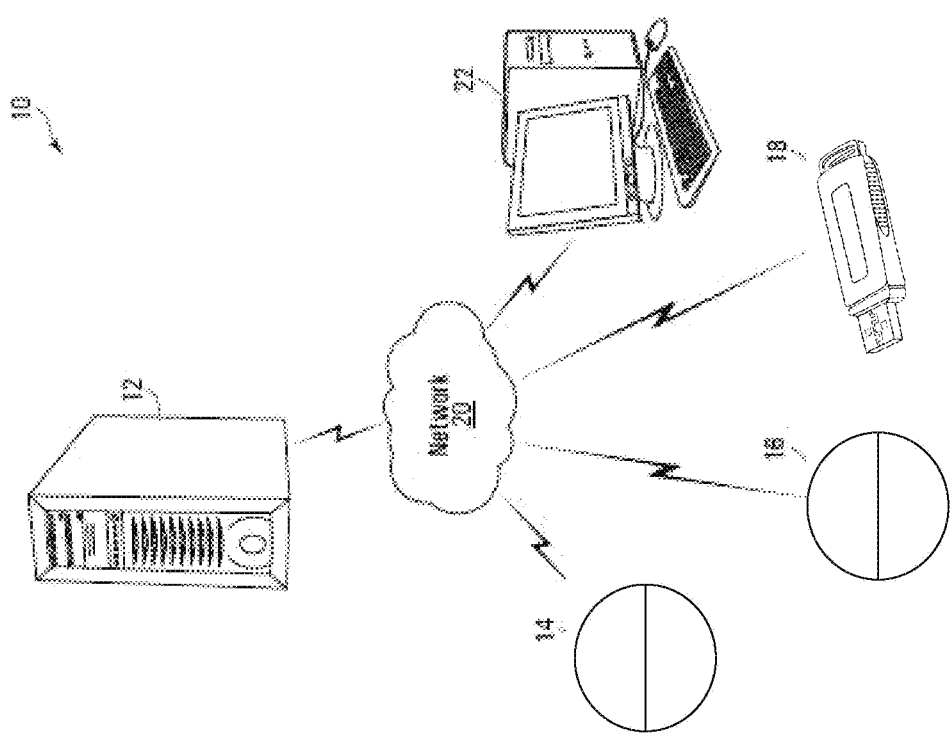
FIG. 14 is a schematic diagram of a computer system for fluid conduit inspection, according to an embodiment.

Referring now to FIG. 14, shown therein is a block diagram illustrating a system 10 for fluid conduit inspection, according to an embodiment. The system 10 includes a data processing server 12, which communicates with a plurality of sensor devices 14, 16, an intermediate data transfer device 18, and a data receiving device 22 via a network 20. The server 12 may receive sensor data from the sensor devices 14, 16 and the intermediary data transfer device 18. The server 12 may analyze the received sensor data. The data receiving device 22 may receive data from the server 12 output the data to a user, for example via a user interface presented on a display device. The data receiving device 22 may be associated with an operator of a fluid conduit being inspected by the sensor devices 14, 16. The intermediary data transfer device 18 may receive sensor data from the sensor devices 14, 16 and transmit the sensor data to the server 12.

The server 12, and devices 18 and 22 may be a server computer, desktop computer, notebook computer, tablet, PDA, smartphone, or another computing device. The intermediary data transfer device 18 may be a memory card reader, flash memory device, USB storage device, or the like. The devices 12, 14, 16, 18, 22 may include a connection with the network 20 such as a wired or wireless connection to the Internet. In some cases, the network 20 may include other types of computer or telecommunication networks. The devices 12, 14, 16, 18, 22 may include one or more of a memory, a secondary storage device, a processor, an input device, a display device, and an output device. Memory may include random access memory (RAM) or similar types of memory. Also, memory may store one or more applications for execution by processor. Applications may correspond with software modules comprising computer executable instructions to perform processing for the functions described below. Secondary storage device may include a hard disk drive, floppy disk drive, CD drive, DVD drive, Blu-ray drive, or other types of non-volatile data storage. Processor may execute applications, computer readable instructions or programs. The applications, computer readable instructions or programs may be stored in memory or in secondary storage, or may be received from the Internet or other network 20.

Input device may include any device for entering information into device 12, 14, 16, 18, 22. For example, input device may be a keyboard, key pad, cursor-control device, touch-screen, camera, or microphone. Display device may include any type of device for presenting visual information. For example, display device may be a computer monitor, a flat-screen display, a projector or a display panel. Output device may include any type of device for presenting a hard copy of information, such as a printer for example. Output device may also include other types of output devices such as speakers, for example. In some cases, device 12, 14, 16, 18, 22 may include multiple of any one or more of processors, applications, software modules, second storage devices, network connections, input devices, output devices, and display devices.

Although devices 12, 14, 16, 18, 22 are described with various components, one skilled in the art will appreciate that the devices 12, 14, 16, 18, 22 may in some cases contain fewer, additional or different components. In addition, although aspects of an implementation of the devices 12, 14, 16, 18, 22 may be described as being stored in memory, one skilled in the art will appreciate that these aspects can also be stored on or read from other types of computer program products or computer-readable media, such as secondary storage devices, including hard disks, floppy disks, CDs, or DVDs; a carrier wave from the Internet or other network; or other forms of RAM or ROM. The computer-readable media may include instructions for controlling the devices 12, 14, 16, 18, 22 and/or processor to perform a particular method.

Devices such as server 12 devices 14, 16, 18 and 22 can be described performing certain acts. It will be appreciated that any one or more of these devices may perform an act automatically or in response to an interaction by a user of that device. That is, the user of the device may manipulate one or more input devices (e.g. a touchscreen, a mouse, or a button) causing the device to perform the described act. In many cases, this aspect may not be described below, but it will be understood.

As an example, it is described below that the devices 14, 16, 18, 22 may send information to the server 12. For example, a user using the device 22 may manipulate one or more inputs (e.g. a mouse and a keyboard) to interact with a user interface displayed on a display of the device 22. Generally, the device may receive a user interface from the network 20 (e.g. in the form of a webpage). Alternatively or in addition, a user interface may be stored locally at a device (e.g. a cache of a webpage or a mobile application).

Server 12 may be configured to receive a plurality of information, from each of the plurality of devices 14, 16, 18, 22.

In response to receiving information, the server 12 may store the information in a storage database. The storage may correspond with secondary storage of the devices 14, 16, 18 and 22. Generally, the storage database may be any suitable storage device such as a hard disk drive, a solid state drive, a memory card, or a disk (e.g. CD, DVD, or Blu-ray etc.). Also, the storage database may be locally connected with server 12. In some cases, storage database may be located remotely from server 12 and accessible to server 12 across a network for example. In some cases, storage database may comprise one or more storage devices located at a networked cloud storage provider.

Figure 15:
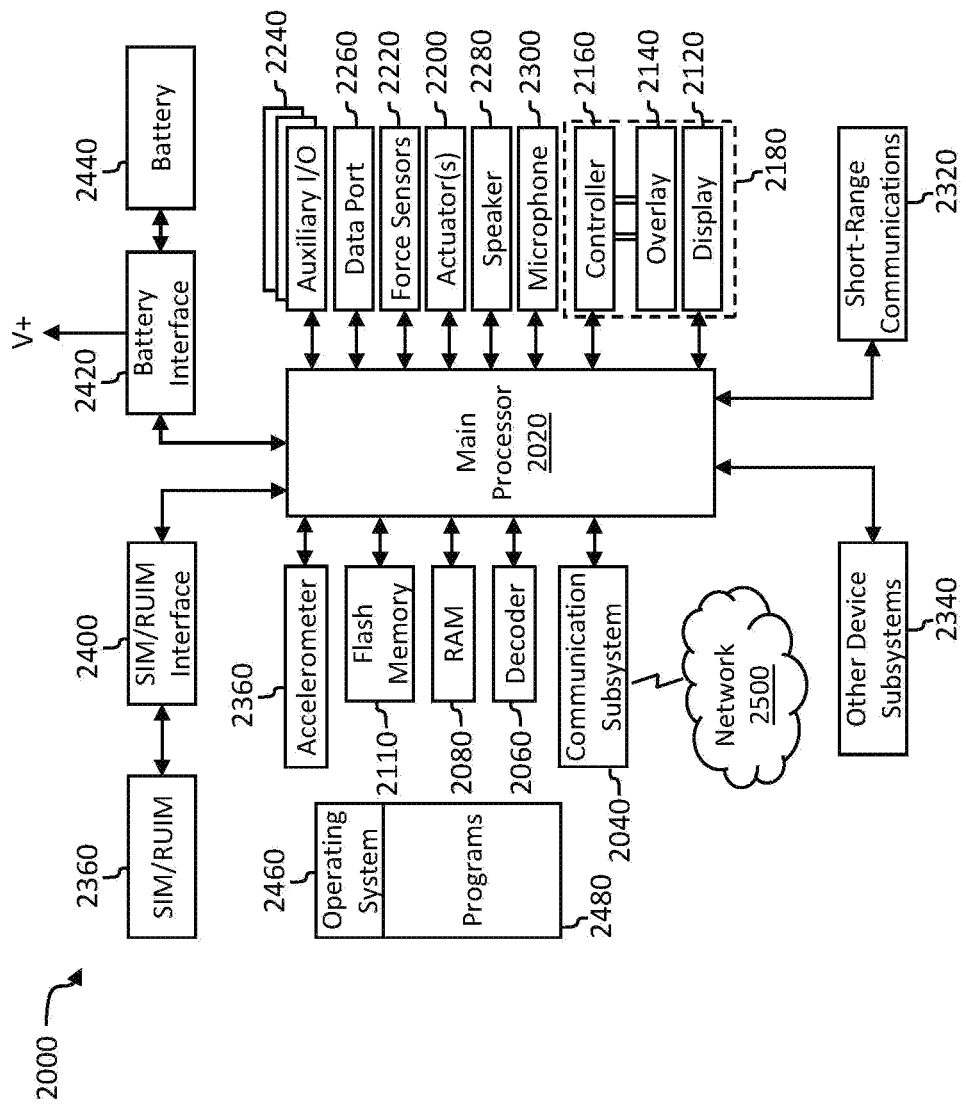
FIG. 15 is a block diagram of a computing device, according to an embodiment.

Referring now to FIG. 15, shown therein is a simplified block diagram of components of a device 2000, such as a mobile device or portable electronic device, according to an embodiment. The device 2000 may be a data processing device (e.g. system 236 of FIG. 2, system 400 of FIG. 4), intermediary data transfer device, or a data receiving device as described herein. The device 2000 includes multiple components such as a processor 2020 that controls the operations of the device 2000. Communication functions, including data communications, voice communications, or both may be performed through a communication subsystem 2040. Data received by the device 2000 may be decompressed and decrypted by a decoder 2060. The communication subsystem 2040 may receive messages from and send messages to a network 2500. The network 2500 may be a wireless network. In other embodiments, the network 2500 may be a wired network. The use of a wired network may better facilitate transfer of the large amounts of data collected and generated by the fluid conduit inspection system.

The wireless network 2500 may be any type of wireless network, including, but not limited to, data-centric wireless networks, voice-centric wireless networks, and dual-mode networks that support both voice and data communications.

The device 2000 may be a battery-powered device and as shown includes a battery interface 2420 for receiving one or more rechargeable batteries 2440.

The processor 2020 also interacts with additional subsystems such as a Random Access Memory (RAM) 2080, a flash memory 2110, a display 2120 (e.g. with a touch-sensitive overlay 2140 connected to an electronic controller 2160 that together comprise a touch-sensitive display 2180), an actuator assembly 2200, one or more optional force sensors 2220, an auxiliary input/output (I/O) subsystem 2240, a data port 2260, a speaker 2280, a microphone 2300, short-range communications systems 2320 and other device subsystems 2340.

In some embodiments, user-interaction with the graphical user interface may be performed through the touch-sensitive overlay 2140. The processor 2020 may interact with the touch-sensitive overlay 2140 via the electronic controller 2160. Information, such as text, characters, symbols, images, icons, and other items that may be displayed or rendered on a portable electronic device generated by the processor 2020 may be displayed on the touch-sensitive display 2180.

The processor 2020 may also interact with an accelerometer 2360 as shown in FIG. 15. The accelerometer 2360 may be utilized for detecting direction of gravitational forces or gravity-induced reaction forces.

To identify a subscriber for network access according to the present embodiment, the device 2000 may use a Subscriber Identity Module or a Removable User Identity Module (SIM/RUIM) card 2360 inserted into a SIM/RUIM interface 2400 for communication with a network (such as the network 2500). Alternatively, user identification information may be programmed into the flash memory 2100 or performed using other techniques.

The device 2000 also includes an operating system 2460 and software components 2480 that are executed by the processor 2020 and which may be stored in a persistent data storage device such as the flash memory 2100. Additional applications may be loaded onto the device 2000 through the wireless network 2500, the auxiliary I/O subsystem 2240, the data port 2260, the short-range communications subsystem 2320, or any other suitable device subsystem 2340.

For example, in use, a received signal such as a text message, an e-mail message, web page download, or other data may be processed by the communication subsystem 2040 and input to the processor 2020. The processor 2020 then processes the received signal for output to the display 2120 or alternatively to the auxiliary I/O subsystem 2240. A subscriber may also compose data items, such as e-mail messages, for example, which may be transmitted over the network 2500 through the communication subsystem 2040.

For voice communications, the overall operation of the portable electronic device 2000 may be similar. The speaker 2280 may output audible information converted from electrical signals, and the microphone 2300 may convert audible information into electrical signals for processing.

While the above description provides examples of one or more apparatus, methods, or systems, it will be appreciated that other apparatus, methods, or systems may be within the scope of the claims as interpreted by one of skill in the art.

The invention claimed is:

1. A method of inspecting a fluid conduit using passive magnetometry, the method comprising:

collecting, with a sensor device, first and second magnetic flux data from inside the fluid conduit without applying an external magnetic field to the fluid conduit, the first and second magnetic flux data representing a residual magnetization of the fluid conduit, the first and second magnetic flux data including a plurality of magnetic flux values recorded at predetermined intervals along a first length and a second length of the fluid conduit, respectively, during a first measurement run by the sensor device, wherein the first and second lengths of the fluid conduit are non-overlapping segments of the fluid conduit;

determining a first statistical spread of the first magnetic flux data and a second statistical spread of the second magnetic flux data using the first and second magnetic flux data, wherein the first and second statistical spreads differ; and identifying a conduit condition of the first length of the fluid conduit by:

comparing the first statistical spread of the first magnetic flux data to the second statistical spread of the second magnetic flux data to determine the fluid conduit condition of the first length of the fluid conduit in comparison to the second length of the fluid conduit; and comparing the first statistical spread of the first magnetic flux data to reference data comprising (i) historical sensor data collected from one or more other fluid conduits, or (ii) one or more thresholds generated from the historical sensor data.

2. The method of claim 1, wherein the fluid conduit comprises a ferromagnetic material.

3. The method of claim 2, wherein the ferromagnetic material is any one or more of carbon steel, steel, stainless steel, and cast-iron.

4. The method of claim 1, wherein the conduit condition is any one or more of an overall condition of the fluid conduit, a localized anomaly, and a volumetric wall loss.

5. The method of claim 1, wherein the conduit condition is an overall condition of the fluid conduit.

6. The method of claim 1, wherein the conduit condition is a localized anomaly and the method further comprises detecting outliers in the magnetic flux data using the statistical spread and identifying the localized anomaly using the detected outliers.

7. The method of claim 6, wherein detecting the outliers in the magnetic flux data includes determining a median for the magnetic flux data and detecting the outliers in the magnetic flux data using the statistical spread and the median.

8. The method of claim 1, further comprising identifying a conduit feature of the fluid conduit, the conduit feature having a different magnetic signature than the rest of the fluid conduit.

9. The method of claim 8, wherein the conduit feature is any one or more of a joint, a bend, a schedule change, a casing, a flange, and a valve.

10. The method of claim 1, wherein collecting the magnetic flux data includes:

collecting a first set of magnetic flux data from inside the fluid conduit and along a length of the fluid conduit; and collecting, at a later time, a second set of magnetic flux data from inside the fluid conduit along the length of the fluid conduit; and wherein identifying the conduit condition includes comparing the first and second sets of magnetic flux data.

11. The method of claim 10, wherein the second set of magnetic flux data is compared to the first set of magnetic flux data by automatically aligning or warping the first and second sets onto each other.

12. A computer system for inspecting a fluid conduit using passive magnetometry, the computer system comprising:

a memory for storing:

first magnetic flux data and second magnetic flux data collected by a sensor device from inside the fluid conduit without applying an external magnetic field to the fluid conduit, the first and second magnetic flux data representing a residual magnetization of the fluid conduit, the first and second magnetic flux data including a plurality of magnetic flux values recorded at predetermined intervals along a first length of the fluid conduit and a second length of the fluid conduit, respectively, during a first measurement run by the sensor device, wherein the first and second lengths of the fluid conduit are non-overlapping segments of the fluid conduit; and reference data comprising (i) historical sensor data collected from one or more other fluid conduits or (ii) one or more thresholds generated from the historical sensor data; and a processor in communication with the memory and configured to:

determine a first statistical spread of the first magnetic flux data and a second statistical spread of the second magnetic flux data using the first and second magnetic flux data, wherein the first and second statistical spreads differ;

identify a conduit condition of the first length of the fluid conduit by:

comparing the first statistical spread of the first magnetic flux data to the second statistical spread of the second magnetic flux data to determine the fluid conduit condition of the first length of the fluid conduit in comparison to the second length of the fluid conduit; and comparing the first statistical spread of the first magnetic flux data to the reference data; and generate an electronic representation of the conduit condition of the first length of the fluid conduit, wherein the electronic representation is stored in the memory.

13. The computer system of claim 12, wherein the conduit condition is a localized anomaly or a volumetric metal loss.

14. The computer system of claim 12, wherein the conduit condition is a localized anomaly, and wherein the processor is further configured to implement an outlier detection algorithm for identifying the localized anomaly using a median magnetic flux value and the statistical spread.

15. The computer system of claim 12, wherein the conduit condition is an overall condition of the fluid conduit.

16. The computer system of claim 12, wherein the electronic representation is any one or more of a visualization including magnetic flux spread data representing the statistical spread and a visualization indicating a location of a localized anomaly.

17. The computer system of claim 12, wherein the processor is further configured to detect a fluid conduit feature of the fluid conduit using the magnetic flux data, the fluid conduit feature having a different magnetic signature than in the rest of the fluid conduit.

* * * * *